United States Patent
Liaw et al.

(10) Patent No.: US 11,740,290 B2
(45) Date of Patent: Aug. 29, 2023

(54) ENERGY STORAGE CELL QUALIFICATION AND RELATED SYSTEMS, METHODS, AND DEVICES

(71) Applicant: Battelle Energy Alliance, LLC, Idaho Falls, ID (US)

(72) Inventors: Boryann Liaw, Idaho Falls, ID (US); Yulun Zhang, Idaho Falls, ID (US); Qiang Wang, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 166 days.

(21) Appl. No.: 17/149,046

(22) Filed: Jan. 14, 2021

(65) Prior Publication Data

US 2022/0214399 A1    Jul. 7, 2022

Related U.S. Application Data

(60) Provisional application No. 62/961,096, filed on Jan. 14, 2020.

(51) Int. Cl.
*G01R 31/00* (2006.01)
*G01R 31/367* (2019.01)
(Continued)

(52) U.S. Cl.
CPC ......... *G01R 31/367* (2019.01); *G01R 31/382* (2019.01); *G01R 31/387* (2019.01);
(Continued)

(58) Field of Classification Search
USPC ................................ 324/300, 426, 432–435
See application file for complete search history.

(56) References Cited

U.S. PATENT DOCUMENTS 8,332,342 B1    12/2012  Saha et al.
8,855,956 B2    10/2014  Thomas-Alyea
(Continued)

FOREIGN PATENT DOCUMENTS

CN    105629175 A    6/2016
CN    105717456 A    6/2016
(Continued)

OTHER PUBLICATIONS

Hendricks et al., "A failure modes, mechanisms, and effects analysis (FMMEA) of lithium-ion batteries," J. Power Sources, vol. 297, (2015), pp. 113-120.
(Continued)

*Primary Examiner* — Vincent Q Nguyen
(74) *Attorney, Agent, or Firm* — TraskBritt

(57) ABSTRACT

Energy storage cell qualification and related systems, methods, and devices are disclosed. A method of qualifying rechargeable battery cells includes taking measurements on the rechargeable battery cells, determining specific capacity distributions of the rechargeable battery cells as a function of a number of discharge cycles based on the measurements, determining one or more specific capacity thresholds to separate the specific capacity distributions of the rechargeable battery cells into two or more classifications, and qualifying the rechargeable battery cells into the two or more classifications based, at least in part, on the specific capacity distributions and the one or more specific capacity thresholds. A method of implementing rechargeable battery cells into product manufacturing and qualifying the rechargeable battery cells, and deploying those of the rechargeable battery cells qualified into a first classification of the two or more classifications into the product.

18 Claims, 12 Drawing Sheets

(51) Int. Cl.

| | |
|---|---|
| *G01R 31/387* | (2019.01) |
| *G01R 31/385* | (2019.01) |
| *G01R 31/382* | (2019.01) |
| *H02J 7/00* | (2006.01) |
| *H01M 10/48* | (2006.01) |
| *G01R 31/392* | (2019.01) |
| *H01M 10/0525* | (2010.01) |

(52) U.S. Cl.
CPC ....... *G01R 31/3865* (2019.01); *G01R 31/392* (2019.01); *H01M 10/0525* (2013.01); *H01M 10/48* (2013.01); *H02J 7/0048* (2020.01)

(56) References Cited

U.S. PATENT DOCUMENTS

| | | |
|---|---|---|
| 8,901,892 B2 | 12/2014 | Yazami et al. |
| 9,130,248 B2 | 9/2015 | Laskowsky et al. |
| 9,207,285 B1 | 12/2015 | Swanton et al. |
| 9,625,532 B2 | 4/2017 | Gering |
| 10,209,314 B2 | 2/2019 | Garcia et al. |
| 10,338,153 B2 | 7/2019 | Hariharan et al. |
| 10,556,510 B2 | 2/2020 | Yazami |
| 2006/0284617 A1 | 12/2006 | Kozlowski et al. |
| 2009/0322283 A1 | 12/2009 | Zhang et al. |
| 2010/0121587 A1* | 5/2010 | Vian .................. G01R 31/367 702/63 |
| 2011/0288797 A1 | 11/2011 | Schmidt |
| 2011/0301931 A1 | 12/2011 | Gering |
| 2012/0179283 A1 | 7/2012 | Krause |
| 2013/0320989 A1 | 12/2013 | Inoue et al. |
| 2014/0306712 A1 | 10/2014 | Esnard-Domerego |
| 2015/0081237 A1 | 3/2015 | Paris et al. |
| 2015/0349385 A1 | 12/2015 | Hu et al. |
| 2016/0155995 A1* | 6/2016 | Takahata ........... H01M 10/0431 429/94 |
| 2018/0088181 A1 | 3/2018 | Jiang et al. |
| 2018/0095141 A1 | 4/2018 | Wild et al. |
| 2018/0292465 A1 | 10/2018 | Osara et al. |
| 2019/0113577 A1 | 4/2019 | Severson et al. |
| 2019/0229378 A1 | 7/2019 | Zhang et al. |
| 2019/0250599 A1 | 8/2019 | Ratiu et al. |
| 2020/0028179 A1 | 1/2020 | He et al. |
| 2020/0028219 A1 | 1/2020 | Lee et al. |
| 2020/0183358 A1 | 6/2020 | Prudhomme et al. |
| 2020/0209319 A1* | 7/2020 | Mitsui .................. H01M 10/42 |

FOREIGN PATENT DOCUMENTS

| | | |
|---|---|---|
| CN | 105891724 A | 8/2016 |
| CN | 110658460 A | 1/2020 |
| WO | 2007/024426 A2 | 3/2007 |
| WO | 2012/116156 A2 | 8/2012 |
| WO | 2018/112818 A1 | 6/2018 |
| WO | 2020/033343 A1 | 2/2020 |

OTHER PUBLICATIONS

Yang et al., "Mechanistic Model of Charge Retention in AB2-Based Nickel Metal Hydride Systems," Electrochemical Society Proceedings, vol. 2002-30, (2005), pp. 87-99.

* cited by examiner

ENERGY STORAGE CELL QUALIFICATION AND RELATED SYSTEMS, METHODS, AND DEVICES

CROSS-REFERENCE TO RELATED APPLICATIONS

This application claims the benefit under 35 U.S.C. § 119(e) of U.S. Provisional Patent Application Ser. No. 62/961,096, filed Jan. 14, 2020, the entire disclosure of which is hereby incorporated herein by this reference.

STATEMENT REGARDING FEDERALLY SPONSORED RESEARCH OR DEVELOPMENT

This invention was made with government support under Contract Number DE AC07-05ID14517 awarded by the United States Department of Energy. The government has certain rights in the invention.

TECHNICAL FIELD

This disclosure relates generally to energy storage cell qualification, and more specifically to qualification of rechargeable batteries into classifications and the role of rechargeable battery cell qualification for a battery design-prototyping-production-deployment (DPPD) cycle.

BACKGROUND

It is quite well accepted that energy storage systems (ESSs) will play a pivotal role in the electrification of the energy supply chain. ESSs are even more critical when deep renewable energy penetration in power generation is anticipated that requires ESSs to support both traditional grid distribution and distributed energy resource (DER) systems to facilitate this transformation in the coming decades. Among all possible ESS technologies, battery-based energy storage systems (BESSs) are some of the most favorable because BESSs may be configured with sufficient flexibility and scale to support multiple purposes and functions in ESS and receive the benefits born from the multi-purpose, multi-functionality characteristics. This is particularly true for the lithium-ion battery (LIB)-based BESS (LIBESS).

BRIEF SUMMARY

In some embodiments a method of qualifying rechargeable battery cells includes taking measurements on the rechargeable battery cells, determining specific capacity distributions of the rechargeable battery cells as a function of a number of discharge cycles based on the measurements, determining one or more specific capacity fade modes and the corresponding thresholds to separate the specific capacity distributions of the rechargeable battery cells into two or more classifications, and qualifying the rechargeable battery cells into the two or more classifications based, at least in part, on the specific capacity distributions and the one or more specific capacity fade modes and the corresponding thresholds.

In some embodiments a method of implementing rechargeable battery cells into product includes manufacturing the rechargeable battery cells; qualifying the rechargeable battery cells into two or more classifications based, at least in part, on electrochemical analytic diagnosis (eCAD) analysis; deploying those of the rechargeable battery cells qualified into a first classification of the two or more classifications into the product; and excluding those of the rechargeable battery cells qualified into one or more other classifications of the two or more classifications from deployment into the product.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
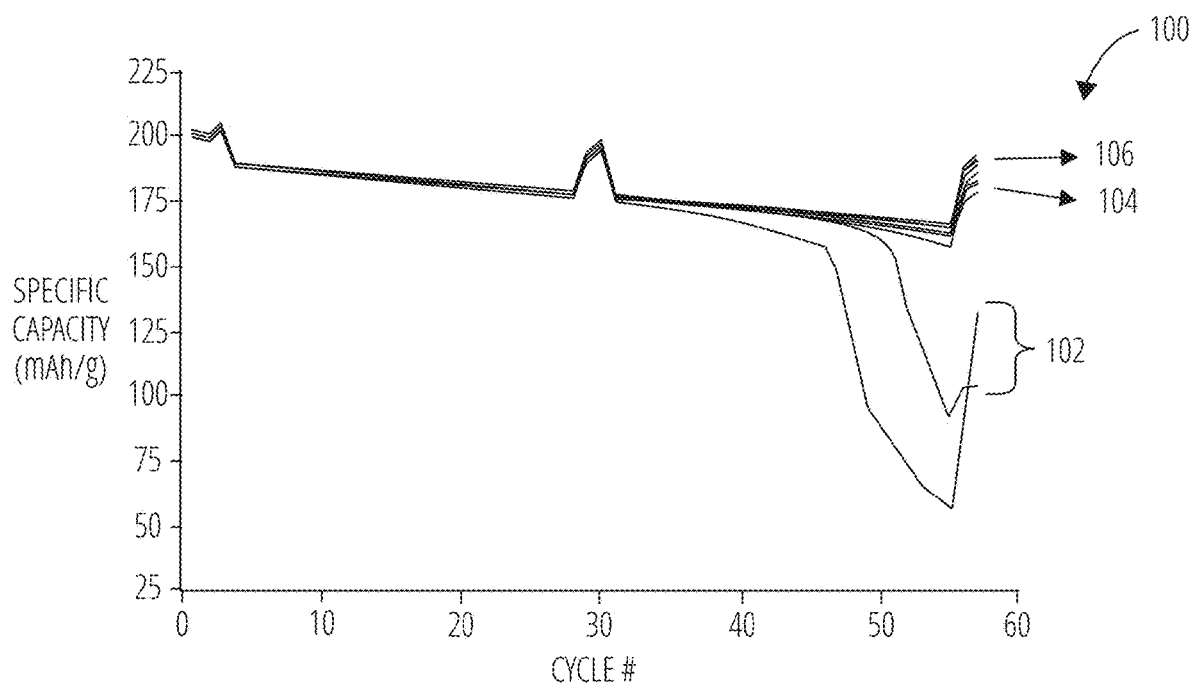
FIG. 1 is a specific capacity distribution plot illustrating charge retention behavior of 14 example Li||NMC-622 rechargeable cells (e.g., including $LiNi_{0.6}Mn_{0.2}Co_{0.2}O_2$)

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Rechargeable lithium battery (RLB) technology is transforming portable devices, vehicle electrification, and grid modernization. To make RLB durable, reliable, and safe, conducting quantitative failure analysis (FA) and failure mode and effect analysis (FMEA) to identify failure mechanism and to understand the failure under the operating conditions is critical and a prerequisite to improve RLB design and operation. However, this ability is often overlooked or even lacking. The FA is often conducted by laboratory testing and postmortem analysis, and the knowledge typically is empirical. Disclosed herein is a quantitative approach for FMEA that may reveal how failure modes and effects reduce the capacity of a RLB. This approach is based on the state of the battery for FMEA, contrary to the conventional approach based on operating or testing conditions. As part of the FMEA method, the results are converted from the experimental conditions to a state-of-charge (SOC)-based methodology for FA. Such a conversion may separate the thermodynamic and kinetic attributes from the experiments to the compositional changes in the electrode, so the loss and the utilization of the active materials may be determined, respectively.

Li metal electrode (LME) is sometimes considered the "holy grail" for high-energy rechargeable Li battery (RLB) designs that surpass 350 Wh kg$^{-1}$ for electric vehicle applications. Yet, to date RLB designs encounter cycle life issues associated with LME performance. Rather than rely on electrochemical cycle aging testing to determine capacity variations from experimental conditions and physical-chemical characterizations of electrode materials to understand LME performance, embodiments disclosed herein include a comprehensive analytic diagnosis on cell performance using an electrochemical evaluation technique.

Some of the underlying failure mechanisms associated with LME are known in the art. Such failure mechanisms are primarily due to the solid electrolyte interphase (SEI) formation that consumes the electrolyte and leads to captivation of active Li into "inactive" or "dead Li" (both are causes of loss of Li inventory (LLI)) and the associated mass transport problems. There is, however, little known success to quantify these attributes to improve cycle life. To extend cycle life and sustain reliable operation of these RLBs, embodiments disclosed herein identify and quantify failure modes and effects on the performance of LME in situ and operando. Embodiments disclosed herein introduce an accurate and precise "electrochemical analytic diagnosis (eCAD)" method to determine the attributes and amount of capacity loss in LME-based RLB during cycle aging. This method clearly identifies and quantifies capacity fade due to (1) loss of active materials (LAM) and LLI and (2) under-utilization of the electrode active materials (UAM) due to kinetic polarization hindrance (KPH) that comes from the disparity in rates between the mass transport in the porous electrodes and the reaction kinetics at the interfaces.

Embodiments disclosed herein offer a comprehensive comparison and data analytic capability superior to prior known technology, such as those using incremental capacity analysis (dQ/dV) or the like. Embodiments disclosed herein emphasize thermodynamic state determination to derive accurate interpretation and inference of the experimental data based on the state-of-charge (SOC) changes in the cell and the performance under the influence of operating conditions. Such knowledge may be useful for developing proper guidance to improve RLB design and operation. The knowledge gained from the thermodynamic aspect should be more universal for the cell chemistry than those from kinetic aspects (e.g., UAM and KPH), which may be more sensitive to the cell design metrics and scales that extend from materials, electrodes, and to the cell. Since this approach is quantitative, a failure mode may be identified and its effect on performance quantified.

Furthermore, any deviations observed in the operating or testing conditions may be easily aligned with the performance metrics of the cell at a defined state. Such a thermodynamic state-based failure mode and effect analysis (FMEA) on RLB functions is non-invasive and may be used in operando. The ability to quantify failure modes and effects as a function of the "state of the system" is unique and beneficial for practical applications.

To accelerate the adoption of LIBESS to support future infrastructure needs, more intelligent functionalities of LIBESS to support this intensified electrification in the energy supply chain are needed due at least in part to the following factors:

Power generation by wind and solar is becoming increasingly cost competitive. However, because of their characteristics of intermittency to meet the conventional grid transmission requirements, BESS is critical as an enabler;

Additional demands to incorporate BESS with DER are high;

Islanding of microgrids is becoming more favorable with cost benefits and efficiency; and The desire for more secured energy supply and resilience is in favor of distribution dispatch.

These scenarios in the functionality of the LIBESS may rely on more basic understanding of how to improve the durability, performance, reliability, and safety of the LIBESS in operation. Although better functionality of LIBESS could be achieved by better battery designs, what is truly needed is a better battery control and management (BCM) strategy and methodology. The capabilities disclosed herein in battery diagnostics and prognostics (BDP) are key to successful implementation of the BCM technology. Embodiments disclosed herein address this basic need in the battery technology research and deployment.

Rechargeable batteries are key to advance consumer electronics, transportation and utility grid. Battery performance is tested in laboratories and verified by design-build-testing iterations in the product development. Such a process can make batteries that satisfy customers but is not sufficient to handle faults and risks. To avoid recalls and support technology development and deployment (TDD), managing faults and risks is vital to industry. Failure analysis (FA) is often conducted case-by-case, lacking a systematic approach to mitigate risks from fundamentals. In the long run TDD may become inefficient and costly as a result. The electrochemical analytic diagnosis (eCAD) can address such issues. The eCAD uses physical principles to define battery performance metrics on design specification. The model prediction can enable cell qualification by quantitative failure mode and effect analysis (FMEA) from design, prototyping, to production via validation.

Currently, battery manufacturers and power system integrators (manufacturers' customers) use battery cell testing, sorting, selection, and grouping to conduct quality control and quality assurance (QC/QA). Generally speaking, this is a "cell qualification" process. Yet the goal is to achieve consistent, reliable, and safe performance of a battery system in design and construction of the energy storage systems for applications. The conventional design-build-test (DBT) product development cycle does not provide a consistent, robust and reliable method and platform to ensure performance and compliance that can be achieved together with fault detection and risk mitigation.

Currently, the product development cycle using the empirical DBT approach is resource limited, time consuming, and costly. Also, this DBT methodology is not reliable because it is often a black-box approach that relies on a large set of data from testing. Testing requires a heavy investment on equipment, facility, and personal training, and is prone to human errors. The data obtained from testing cannot avoid bias, error and complicity of the influences from test conditions. These factors are raising the cost for production but also introduce a significant amount of faults and risks that the DBT cannot handle. According to embodiments disclosed herein, eCAD resolves these issues with physical principles-based and predictive capability to detect errors and faults for risk management and cost reduction. Embodiments disclosed herein reduce the impact on environment (emissions, pollutions) and also societal impacts by introducing a reliable and trustworthy manufacturing capability. For broader impact on other manufacturing sectors, embodiments disclosed herein may create more value as a whole for product developments that rely on conventional DBT cycles.

According to embodiments disclosed herein, eCAD provides such a platform due at least in part to the following reasons that are different from the conventional DBT approach. (1) The eCAD can use a physical principles-based approach. (2) The eCAD can enable the correlation of performance metrics and design specifications validated by physical principles and based on thermodynamic states of the system, not by empirical correlations of testing conditions and boundaries, which often are affecting or affected by kinetics. (3) Due to the state- and physical principles-based approach, eCAD can be quantitative and immune from the complexed dependence on cell design, processing, and test conditions that complicate the data analysis and correlation using empirical techniques. (4) eCAD may streamline the entire DBT cycle with easy-to-validate results and predictive models for cell qualification. In short, the eCAD method according to embodiments disclosed herein may revolutionize the conventional DBT product development process and enable predictive model-based DBT to afford the production of reliable and safe battery products. This process may be validated for consistency due to the nature of state-based correspondence, which empirical methods cannot.

Embodiments disclosed herein include a robust failure mode and effect analysis (FMEA) tool that conducts quantitative verification of battery performance to enable support of intelligent functionality of LIBESS. Such an FMEA tool is not available today even in the industry. Embodiments disclosed herein transform this FMEA tool into a platform that will be capable of validating LIBESS performance via model regression and prediction. Conduction of quantitative verification of LIBESS performance calls for validation using advanced artificial intelligence and machine learning (AI-ML)-based diagnostics and prognostics. Embodiments disclosed herein address a need to advance FMEA capability for LIBESS.

Embodiments disclosed herein include FMEA capabilities for LIBESS, a leap toward even more advanced data-driven AI-ML based approaches to support reliable performance and safe operation of the LIBESS.

Failure analysis (FA) is important to guide cell design and qualification to address safety issues, but is often focused on testing and verification, and overlooked over validation. Quantitative electrochemical analytic diagnosis (eCAD), as disclosed herein, may address currently qualitative diagnosis via postmortem investigations. The eCAD method may accelerate progress in improving cell design and assessment for better cycle life, reliability, and safety. Using rechargeable Li metal battery cells as an example, it is disclosed herein how to quantify Li metal loss during life cycle of any individual Li metal electrode and cell. Embodiments disclosed herein may address life cycle failures toward improved reliability and safety.

The eCAD is a standardized electrode and cell analysis tool for cell design and performance assessment. The eCAD technique is a state function-based analysis, which is less sensitive to cell design variations and test conditions. The eCAD technique may separate, identify, and quantify various attributes of capacity fade for different combinations of electrode architecture, electrolyte composition, and cell balance. The eCAD technique may also establish a quantitative tool for reliable cycle life prediction and cell performance assessment for rechargeable Li metal cells.

In some embodiments, in order to preserve materials and extend cycle life of rechargeable Li metal cells, a two-prong approach is used. A first prong of the two-prong approach includes quantitative FMEA to identify gaps through capacity loss analysis. Thermodynamic stat-based analysis may be used to separate capacity losses from thermodynamic (i.e., NMC, Li, and electrolyte losses) and kinetic (i.e., polarization) attributes. A second prong of the two-prong approach includes using reactive molecular dynamics (r-MD) simulation to understand fundamental kinetic barriers that prevent dense Li deposition. Crystallinity and grain boundary, heterogeneity, morphology, as a function of rate, time, and in some embodiments external pressure and micromechanics, at multi-scales, may be assessed.

A robust, safe battery operation is vital for consumer electronics, electric vehicles, and power grid. Evaluating battery performance in laboratories often is short of critical, quantitative failure studies and analyses before deployment. The qualification of cells is often based on performance against specification and determined by a small set of parameters: e.g., cell capacity, rest voltage and internal direct current (DC) resistance; as indicators of their quality. Even a very consistent build of cells could have diverse fates in failure, rendering such cell qualification method ineffective for safety and risk assessments. Disclosed herein are effective methods to afford detecting anomalies in a battery build for early fault detection. Embodiments disclosed herein use an electrochemical analytic diagnosis to decipher good, bad, and ugly cells of a build through aging conditions to quantify their propensity to eventual failures. This failure mode and effect analysis (FMEA) and quantification significantly advance cell screening, qualification, early fault detection, and life prediction to improve battery control and management for reliable, safe operations.

Disclosed herein is a quantitative failure analysis (FA) method to quantify effectiveness of cell qualification for reliable and safe operation of rechargeable Li batteries (RLBs). The method predicts possible failure based on the state of the battery under any operating conditions. An illustrative example of a precise and accurate electrochemical analytic diagnosis (eCAD) of 14 rechargeable Li||NMC-622 cells of the same build is analyzed herein. The FA by eCAD can quantitatively decipher good, bad and ugly cells in cycle aging. Such cell qualification is achieved by using thermodynamic states of the cell, not experimental conditions, as the quantification basis for FA. The method provides meaningful inference of the failure mode and effect analysis (FMEA) to reveal diverse "dead Li" formation that affects the reversibility of the Li anode and charge retention in the cell. Embodiments disclosed herein highlight the potential to improve cell qualification, with strong implications for fault detection, failure analysis, safety risk management, state estimation, and life prediction for reliable and safe RLB operations.

Significant advancements in the rechargeable Li battery (RLB) technology propel the use of RLB in portable electronic devices, as recognized in the award of the 2019 Nobel Prize in Chemistry. The acceptance of RLB also inspires the electrification of vehicles and energy storage in the utility grid. The RLB systems being used in these applications are demanding better performance and pushing the operation envelopes that raises great concerns on reliability and safety. Cell qualification faces unprecedented demands for precision and accuracy that challenges the conventional practice today. As RLB systems become more massive and complicated, RLB cells are placed in various configurations to function as a pack or bank, and the consistency in performance in these cells is becoming critical. The rule of selecting compatible cells in such configurations also becomes complicated and challenging. Traditionally, such compatibility is considered in three aspects: capacity, rest voltage, and internal resistance of the cells. When the cells are placed in a topological configuration with series and parallel connections, the task of matching capacity, rest voltage, and internal resistance among the cells is not trivial for optimizing performance, reliability, and safety of the battery system. Furthermore, the cells will suffer degradation over time with use. The degree and rate of such degradation among the cells might be diverse and may be difficult to quantify until they fail. Late detection of cell failure could significantly raise reliability and safety concerns.

Embodiments disclosed herein use a failure quantification as criteria to assess RLB cell quality. A build of 14 Li||Li$_x$Ni$_{0.6}$Mn$_{0.2}$Co$_{0.2}$O$_2$ (NMC-622) coin cells is discussed herein to illustrate some embodiments of the disclosure. As previously mentioned, Li metal electrode (LME) is the "holy grail" for next generation high energy RLB designs. Currently, most Li metal RLB designs suffer short cycle life issues. Some failure mechanisms are known for aprotic liquid electrolyte cell designs, primarily due to the solid electrolyte interphase (SEI) formation, leading to electrolyte consumption and "inactive" or "dead Li" formation (both are root causes in the loss of Li inventory (LLI)) and the associated kinetic problems. The use of LME RLB cells in the present disclosure provides a unique opportunity to exemplify the unique cell qualification concept. To illustrate this concept, a quantitative electrochemical analytic diagnosis (eCAD) method was developed that can accurately and precisely determine the attributes and the amount of capacity loss in LME-based RLB during cycle aging. This method clearly identifies and quantifies capacity fade (QF) due to (1) the loss of active materials (LAM) and LLI (QF$_{LAM}$ and QF$_{LLI}$) and (2) the under-utilization of the active materials (UAM) in the electrode due to rate-dependent polarization (QF$_{IR}$) and kinetic polarization hindrance (KPH and QF$_{KPH}$). This method offers a thermodynamic state-of-charge (SOC)-based data analytic capability more reliable than any prior techniques, such as the incremental capacity analysis (dQ/dV) or the like. This approach provides the basis for the thermodynamic state determination to yield accurate Li content in the NMC-622 composition and its changes in the cell reaction. Thus, embodiments disclosed herein enable quantification of thermodynamic attributes of the QF and separate them from the kinetic ones under the influence of operating conditions (e.g., polarization).

In some embodiments a method of qualifying rechargeable battery cells includes taking measurements on the rechargeable battery cells, determining specific capacity distributions of the rechargeable battery cells as a function of a number of discharge cycles based on the measurements, determining one or more specific capacity thresholds to separate the specific capacity distributions of the rechargeable battery cells into two or more classifications, and qualifying the rechargeable battery cells into the two or more classifications based, at least in part, on the specific capacity distributions and the one or more specific capacity thresholds. In some embodiments the two or more classifications include a first classification corresponding to high quality rechargeable battery cells and qualifying the rechargeable battery cells into the two or more classifications includes assigning those of the rechargeable battery cells having specific capacity distributions bound by at least one of the specific capacity thresholds to the first classification. In some embodiments the method further includes selecting those of the rechargeable battery cells assigned to the first classification for use in a specific application. In some embodiments the method further includes excluding those of the rechargeable battery cells not assigned to the first classification from use in a specific application. In some embodiments the one or more specific capacity thresholds vary as a function of the number of discharge cycles. In some embodiments the one or more specific capacity thresholds reflect a selected maximum capacity fade rate value. In some embodiments the method further includes identifying capacity failure modes of the rechargeable battery cells using eCAD FMEA, wherein qualifying the rechargeable battery cells into the two or more classifications includes qualifying the rechargeable battery cells into the two or more classifications based, at least in part, on the identified capacity failure modes. In some embodiments identifying the capacity failure modes includes identifying one or more failure modes selected from the group consisting of capacity fade due to loss of active materials in electrodes, capacity fade due to under-utilization of the active materials full capacity caused by IR-polarization, capacity fade due to kinetic polarization hindrance-induced under-utilization, and capacity fade due to loss of lithium inventory. In some embodiments identifying the capacity failure modes includes deriving a universal pseudo open cell voltage versus state of charge curve (pseudo-OCV-SOC curve) from a set of charge-discharge curves obtained at a very slow rate, transforming a discharge curve at C/3 into an IR-free voltage ($V_{IR-free}$) versus specific capacity profile ($V_{IR-free}$-$Q_{C/3}$ profile), transforming the $V_{IR-free}$-$Q_{C/3}$ profile into a $V_{IR-free}$ versus depth of discharge (DOD) profile ($V_{IR-free}$-DOD profile), transforming the $V_{IR-free}$-DOD profile into a scaled $V_{IR-free}$-SOC profile, and aligning the $V_{IR-free}$-SOC profile to the universal pseudo-OCV-SOC curve to reveal the one or more failure modes.

In some embodiments a method of implementing rechargeable battery cells into product includes manufacturing the rechargeable battery cells; qualifying the rechargeable battery cells into two or more classifications based, at least in part, on electrochemical analytic diagnosis (eCAD) analysis; deploying those of the rechargeable battery cells qualified into a first classification of the two or more classifications into the product; and excluding those of the rechargeable battery cells qualified into one or more other classifications of the two or more classifications from deployment into the product. In some embodiments the method further includes employing an analysis-qualification-design-verification (AQDV) loop to complete a battery design-prototyping-production-deployment (DPPD) cycle with quantitative validation procedures and protocols to improve quality of the product. In some embodiments the AQDV loop includes cell qualification of the rechargeable battery cells, materials and electrode design of the rechargeable battery cells, cell design of the rechargeable battery cells, design qualification, product qualification, and performance qualification of the rechargeable battery cells. In some embodiments the AQDV loop includes diagnostics and prognostics, performance analysis, fault detection and life prediction, and quality control and assurance at each of the cell qualification, materials and electrode design, cell design, design qualification, product qualification, and performance qualification. In some embodiments the method further includes identifying a metric to specify a set of criteria for screening, selecting, filtering, and qualifying the first classification. In some embodiments the metric includes thresholds based on capacity failure modes and effects as defined by eCAD failure mode and effect analysis (FMEA). In some embodiments the metric includes a capacity distribution within one or more threshold values and a capacity fade rate. In some embodiments the metric is based at least in part on cell capacity of the rechargeable battery cells measured at a rate of C/20 or lower, cell capacity of the rechargeable battery cells measured at a rate of C/3 or other C/n rate where n is the time in hours to fully discharge the capacity, capacity fade due to loss of active materials in the electrode, capacity fade due to under-utilization of the active material's full capacity caused by IR-polarization, capacity fade due to kinetic polarization hindrance-induced under-utilization, and capacity fade due to loss of lithium inventory. In some embodiments the rechargeable battery cells are taken from a same build and manifest substantially the same charge retention behavior responsive to a first charge-discharge cycle. In some embodiments qualifying the rechargeable battery cells into the two or more classifications includes determining specific capacity distributions of the rechargeable battery cells as a function of a number of discharge cycles, determining one or more specific capacity thresholds to separate the specific capacity distributions of the rechargeable battery cells into the two or more classifications, and qualifying the rechargeable battery cells into the two or more classifications based, at least in part, on the specific capacity distributions and the one or more specific capacity thresholds. In some embodiments the one or more specific capacity thresholds reflect a selected maximum capacity fade rate value.

FIG. 1 is a specific capacity distribution plot 100 illustrating charge retention behavior of 14 example Li∥NMC-622 rechargeable cells (e.g., including $LiNi_{0.6}Mn_{0.2}Co_{0.2}O_2$). A build of the 14 Li∥NMC-622 cells was qualified into three different classes. A highest performing class is referred to herein as "good," and corresponding good specific capacity curves 106 of the "good" cells are indicated in the specific capacity distribution plot 100. A poorest performing class is referred to herein as "ugly," and corresponding ugly specific capacity curves 102 of the "ugly" cells are indicated in the specific capacity distribution plot 100. Between the "good" and "ugly" classes is a "bad" class, and corresponding bad specific capacity curves 104 of the "bad" cells are indicated in the specific capacity distribution plot 100. FIG. 1 shows the charge retention results of these 14 Li∥NMC-622 cells.

The 14 cells are well qualified in the build for consistency in performance in their early life. This is exemplified by their endurance of 25 charge-discharge (C/D) cycles at C/3 (current to charge the cells in three hours) without any deviation from a linear charge retention behavior. The 14 cells exhibit a tight $Q_{C/3}$ capacity distribution of 189.09±0.81 mAh g$^{-1}$ (±0.43%) at cycle 1 and 177.71±0.77 mAh g$^{-1}$ (±0.43%) at cycle 25 with an averaged capacity fade rate of 0.47 mAh g$^{-1}$ cycle$^{-1}$.

Upon performing a reference performance test (RPT-1) at C/10 (current to charge the cells in ten hours) and C/20 (current to charge cells in twenty hours), respectively, to determine charge retention at lower rates, the capacity distribution was widened. At C/10 the standard deviation increased to ±0.70%, and at C/20 the standard deviation increased to ±0.61%.

In the subsequent 25 cycles of aging, the 14 cells began to exhibit a diverse charge retention behavior. Cell #8 and cell #10 showed much shortened cycle life and were therefore classified as "ugly" cells. Cells #2, #3, #4, #6 and #13 were classified as "bad" cells, exhibiting accelerated (nonlinear) charge fade QF and falling outside the ±2σ bounds (e.g., +2σ bound threshold 202 and −2σ bound threshold 204 of FIG. 2) of 95% confidence interval projected from the $Q_{C/3}$ distribution at Cycle 26 with 0.47 mAh g$^{-1}$ cycle$^{-1}$ fade rate and a wider standard deviation (1σ=±0.54%) (See FIG. 2).

Similar capacity distributions and QF behaviors in charge retention are constantly observed in experiments. Such behavior is analyzed herein using a reliable and quantitative failure mode and effect analysis (FMEA) by electrochemical data and analytics (eCAD) to gain more insightful understanding of cell failure. More detail regarding eCAD is discussed with reference to FIG. 13, FIG. 14, FIG. 15, and FIG. 16. Through this practice, a better way is shown to quantify failure effects in order to advance practical cell design and manufacturing and to manage risks toward better reliability and safety. As examples, the charge retention and QF behavior of three representative cells in the good, bad, and ugly classes are analyzed (Table 1 and FIG. 5, FIG. 6, FIG. 7, and FIG. 8) and explained to illustrate the approach of applying this eCAD in a performance-based cell qualification FMEA.

Figure 2:
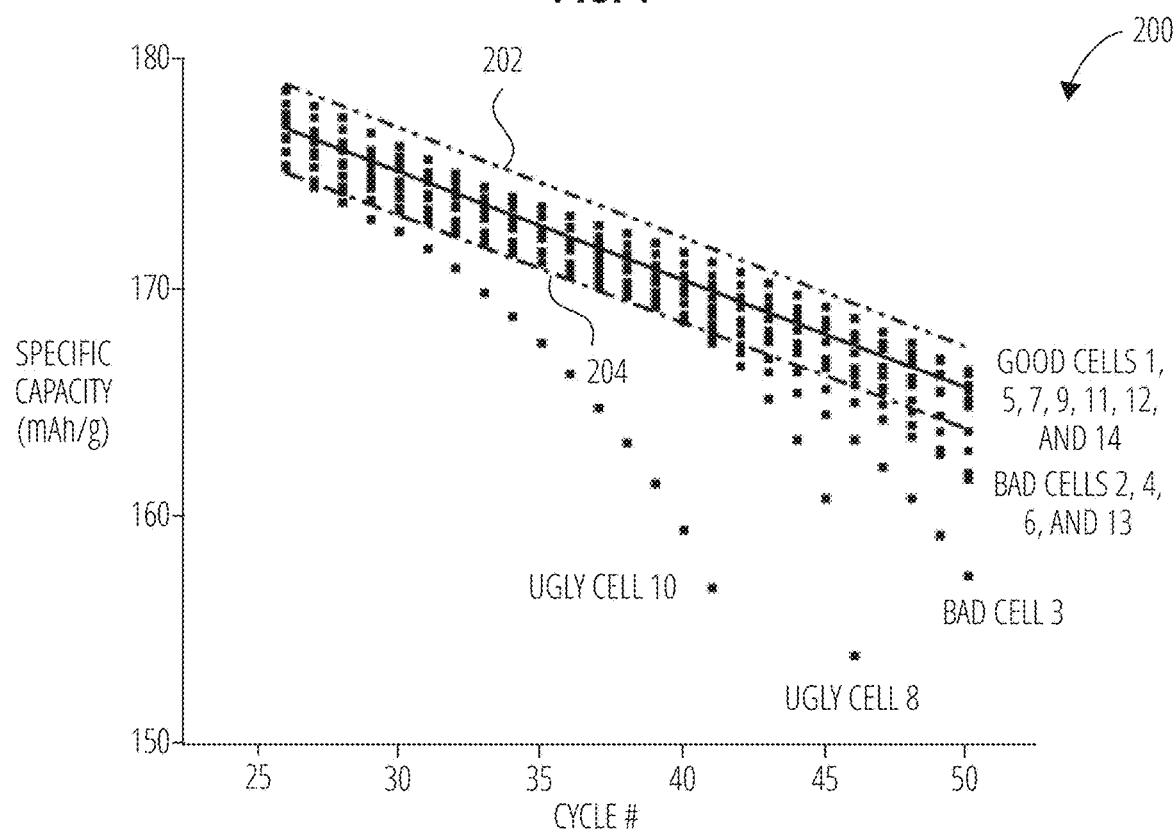
FIG. 2 is a specific capacity distribution plot, which is a portion of the specific capacity distribution plot of FIG. 1.

FIG. 2 is a specific capacity distribution plot 200, which is a portion of the specific capacity distribution plot 100 of FIG. 1. The distribution of the specific capacity of these 14 cells as a function of cycle number presents the severity of the capacity degradation in each cell during life cycle aging. From their charge retention behavior, "good," "bad," and "ugly" cells are identified based on performance.

To enable this classification in the cell qualification process, besides the criteria to remove disqualified cells using "test data-based" direct screening, including the cell capacity, internal resistance, rest open circuit voltage, and/or self-discharge rate; embodiments disclosed herein use additional cell qualification metrics beyond the above-mentioned screening method. These additional cell qualification metrics include criteria of certain thresholds based on capacity failure modes and effects as defined by eCAD FMEA. Taking the 14 cells as examples, the combination of capacity distribution within a tight threshold of within a standard deviation of ±0.5(4)% (e.g., the +2σ bound threshold 202 and −2σ bound threshold 204) plus a strict capacity fade rate of a defined value on the order of 0.4(7) mAh g$^{-1}$ cycle$^{-1}$ are taken as two of the indexes in the cell qualification for high quality cells ("good cells"), as shown in FIG. 2. More importantly, these values are correlated with fading modes and effects associated with capacity loss in a quantitative manner, as discussed with reference to FIG. 3.

Figure 3:
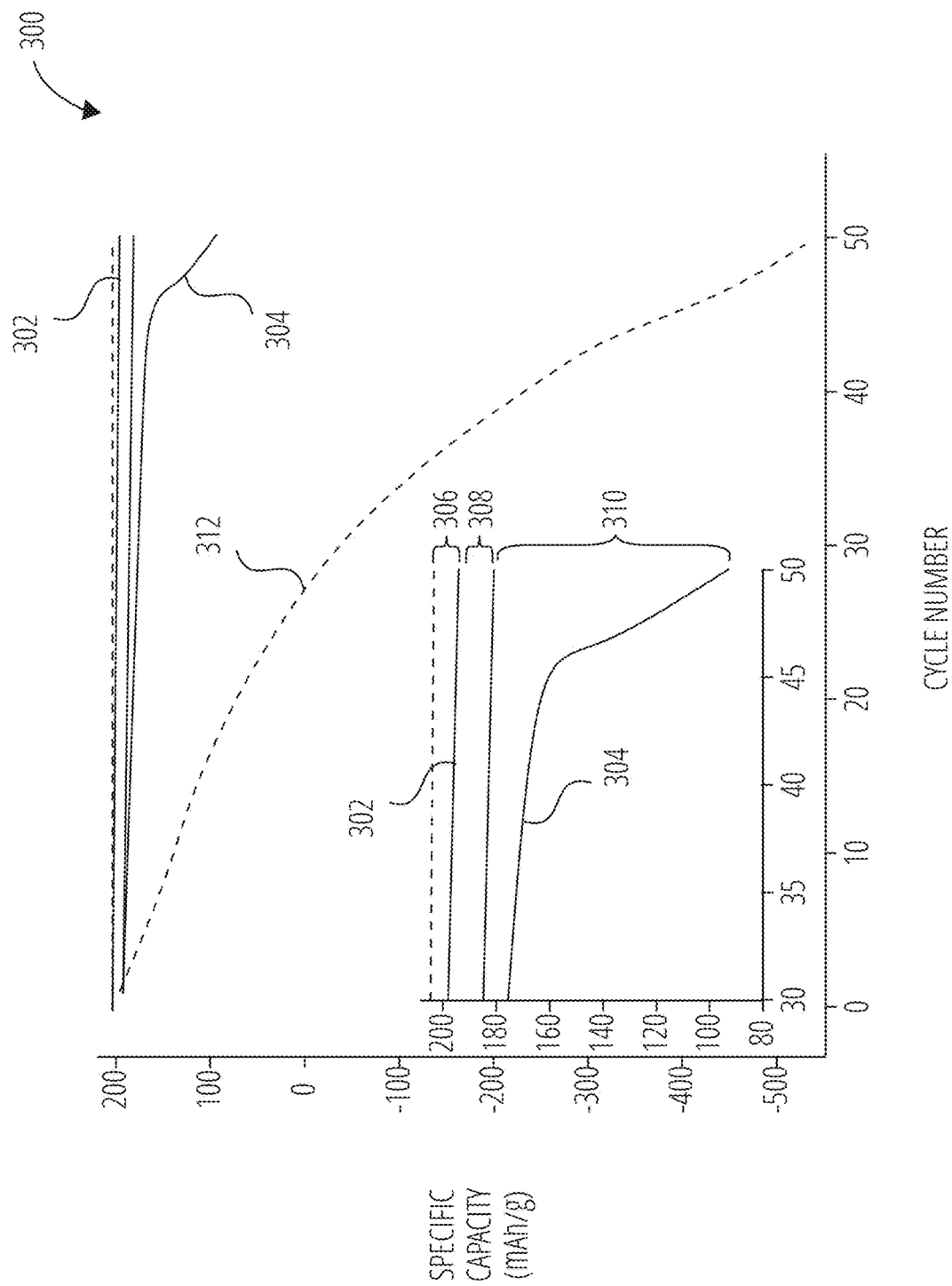
FIG. 3 is a cell capacity failure mode plot, according to some embodiments.

FIG. 3 is a cell capacity failure mode plot 300, according to some embodiments. Defined and quantified herein are the following indices, which include (1) cell capacity measured at a rate of C/20 ($Q_{C/20}$) (C/20 cell capacity 302), (2) cell capacity measured at C/3 ($Q_{C/3}$) (C/3 cell capacity 304), (3) capacity fade that is due to loss of active materials in the electrode ($QF_{LAM}$ 306), (4) capacity fade due to under-utilization of the active material's full capacity caused by IR-polarization ($QF_{IR}$ 308), (5) capacity fade due to kinetic polarization hindrance-induced under-utilization ($Q_{KPH}$ 310), which is often associated with Li diffusion in the electrode materials that could be affected by additional factors that are not included in the IR polarization, and (6) capacity fade due to loss of Li inventory ($QF_{LLI}$ 312), where the Li inventory refers to the availability and amount of reactive Li ions that can participate in the intercalation reaction in NMC.

Such a classification is based on well-verified criteria using thermodynamic and kinetic principles, which allow direct correlations with underlying mechanisms of the physical processes, and with the statistical analysis of the distribution of these indices, for cell qualification.

The classification-based qualification of the cells in this manner and the context to correlate with the physical processes underpinning such qualification in a statistically meaningful manner are quite unprecedented and far more advanced than the current practice in the industry that uses simple testing results and empirical correlations as the basis. The criteria used in the cell classification-based qualification are directly related to the underlying physical processes quantitatively as verified in the FMEA.

Figure 4:
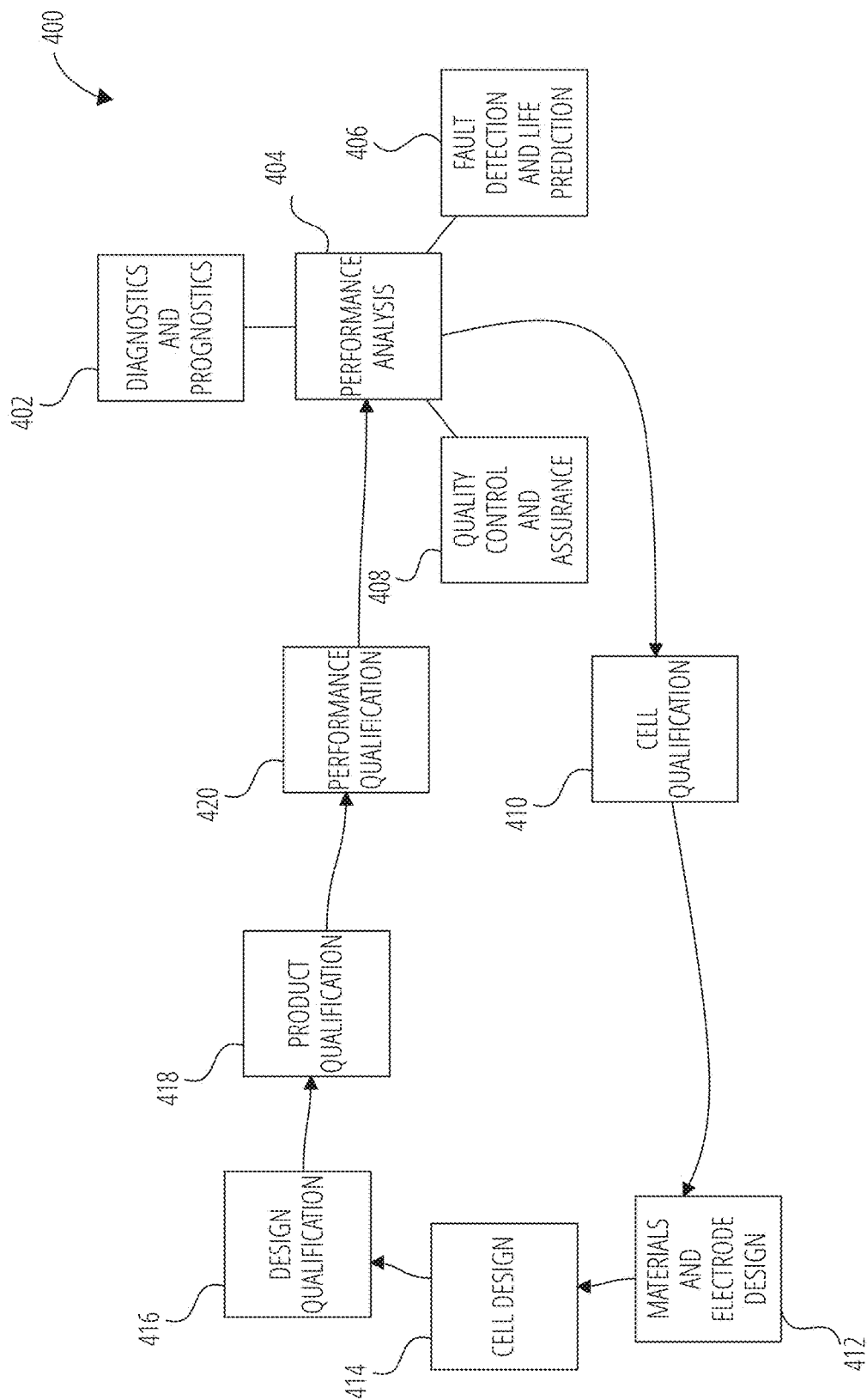
FIG. 4 is an analysis-qualification-design-verification (AQDV) loop for a battery design-prototyping-production-deployment (DPPD) cycle with quantitative validation procedures and protocols to improve product quality control and assurance, according to some embodiments.

FIG. 4 is an analysis-qualification-design-verification loop 400 for a battery design-prototyping-production-deployment (DPPD) cycle with quantitative validation procedures and protocols to improve product quality control and assurance, according to some embodiments. The analysis-qualification-design-verification loop 400 includes diagnostics and prognostics 402, performance analysis 404, fault detection and life prediction 406, quality control and assurance 408, cell qualification 410, materials and electrode design 412, cell design 414, design qualification 416, product qualification 418, and performance qualification 420. The cell qualification 410 component of the analysis-qualification-design-verification loop 400 may be performed as discussed above with reference to FIG. 1, FIG. 2, and FIG. 3. FIG. 4 illustrates that the unique application of eCAD-based FMEA can permit battery cell and performance qualification to enable and enhance battery manufacturing from design, prototyping, and production to deployment with quantifiable quality control and assurance. FIG. 4 illustrates how this unique concept and approach can facilitate battery manufacturing.

In contrast, conventional battery design was conducted from the materials selection to electrode architecture, and then to the cell energy and power balance, which are performed using empirical correlation, engineering optimization using experimental data, and testing of the performance to validate the design and concept. Further optimization of the design and processing leads to prototyping and subsequently production and deployment to the marketplace. Without FMEA, this conventional approach lacks the foundation and ability to verify how much risk and hazardous failure could impact the liability of the product deployment. Inclusion of conventional FMEA may generally be cost prohibitive for a solution, since most optimization increases performance (cost cutting and profit making) but does not minimize possible failure (liability and cost burden). Thus, FMEA is not often practiced in the consumer product manufacturing until it is necessary due to product failures. Nonetheless, the lack of knowledge in risk assessment and prevention could sag a business or a corporation drastically with surprising consequences.

The eCAD-based FMEA approach disclosed herein not only leverages the information used in the conventional approach but also harvests the underlying information through in-depth data analytics to reveal issues associated with failure modes and effects from performance, which can feed useful and critical data back to the entire "design-prototyping-production-deployment" (DPPD) cycle. The capability mimicking "reverse engineering" is not only unconventional but also unprecedented. Information and data collected in the DPPD cycle are used to create the understanding of how a design results in anticipated performance as revealed by the eCAD data analytics. Via FMEA, how failure impacts the performance is understood so faults in the DPPD cycle are detected in due time. Using such a quantitative analytic feedback in the loop in the DPPD cycle, anomalies that lead to failure can be tackled and the knowledge is used to improve the DPPD cycle. The conventional design-build-test paradigm is now converted to an analysis-qualification-design-verification loop 400 to complete the entire DPPD cycle with quantitative validation process to ensure product quality control and assurance.

In some embodiments a battery cell qualification process (e.g., cell qualification 410) employs an analysis-qualification-design-verification (AQDV) loop (e.g., analysis-qualification-design-verification loop 400) to complete a battery design-prototyping-production-deployment (DPPD) cycle with quantitative validation procedures and protocols to improve product quality control and assurance, as illustrated in FIG. 4. A battery cell qualification process is a method that can be used to screen, select, filter, and qualify a certain portion of the product of the same build for a specific purpose of use in an application. This process may include a metric to specify the criteria for the screening, selection, filtering, and qualification for a specific class of the production in the same build that can satisfy the needs and specification for the intended application. A selection procedure may be used in this qualification process.

In some embodiments An AQDV loop may include a failure analysis (FA) and failure mode and effect analysis (FMEA) using eCAD techniques that can identify and quantify failure modes and effects based on battery or cell performance data obtained from testing and test equipment. An example of this analytical approach and analysis is illustrated in FIG. 1, FIG. 2, and FIG. 3. Derivatives from the FA, FMEA, or eCAD as analytics may be used in the battery cell qualification process. Correlations derived from the analytic results and the design parameters may be used as the basis for verification of the relationships between the design parameters and the outcomes in performance. Such correlations may be used to verify the relationships as derived for scale up from the initial design, prototypes, optimization, to production of the battery cells.

Figure 5:
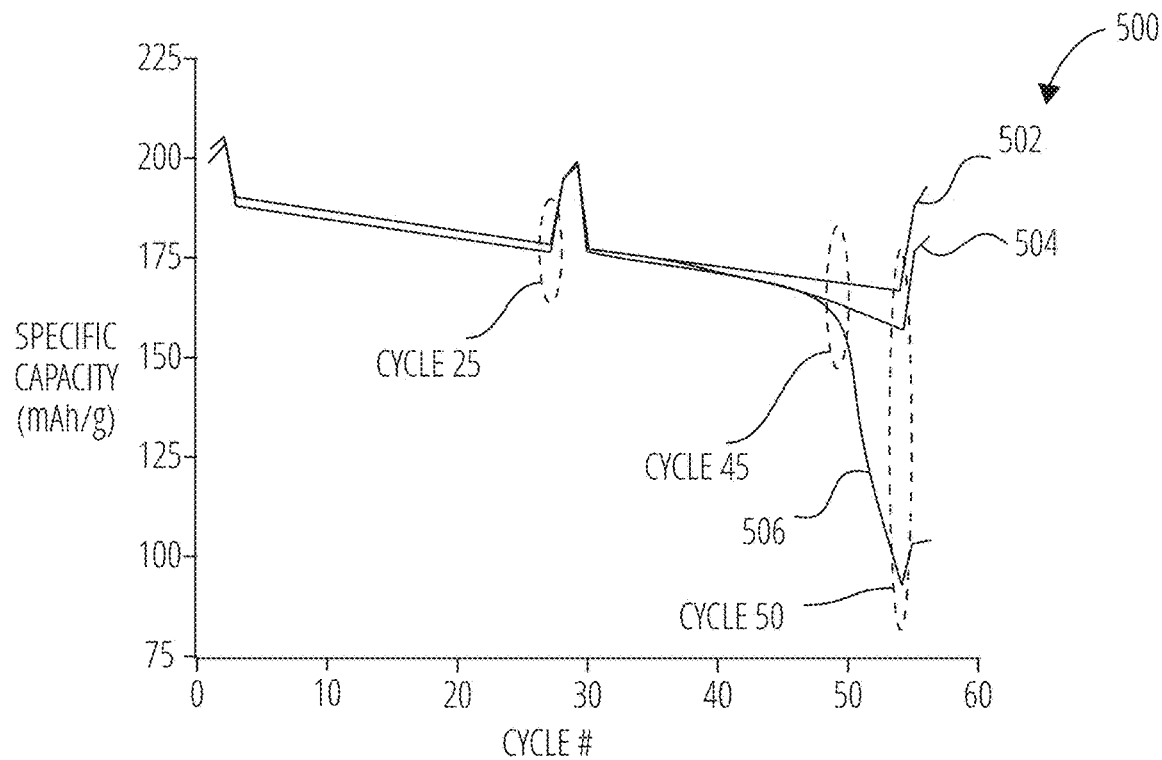
FIG. 5 is a specific capacity distribution plot illustrating charge retention behavior of three representative cells of the 14 example Li||NMC-622 rechargeable cells discussed above with reference to FIG. 1.

FIG. 5 is a specific capacity distribution plot 500 illustrating charge retention behavior of three representative cells of the 14 example Li∥NMC-622 rechargeable cells discussed above with reference to FIG. 1. The three representative cells include one cell from each of the good, bad, and ugly classes: cell #7—good, cell #3—bad, and cell #8—ugly. Accordingly, the specific capacity distribution plot 500 includes a cell 7 specific capacity curve 502 corresponding to cell #7, a cell 3 specific capacity curve 504 corresponding to cell 3, and a cell 8 specific capacity curve 506 corresponding to cell 8.

Figure 6:
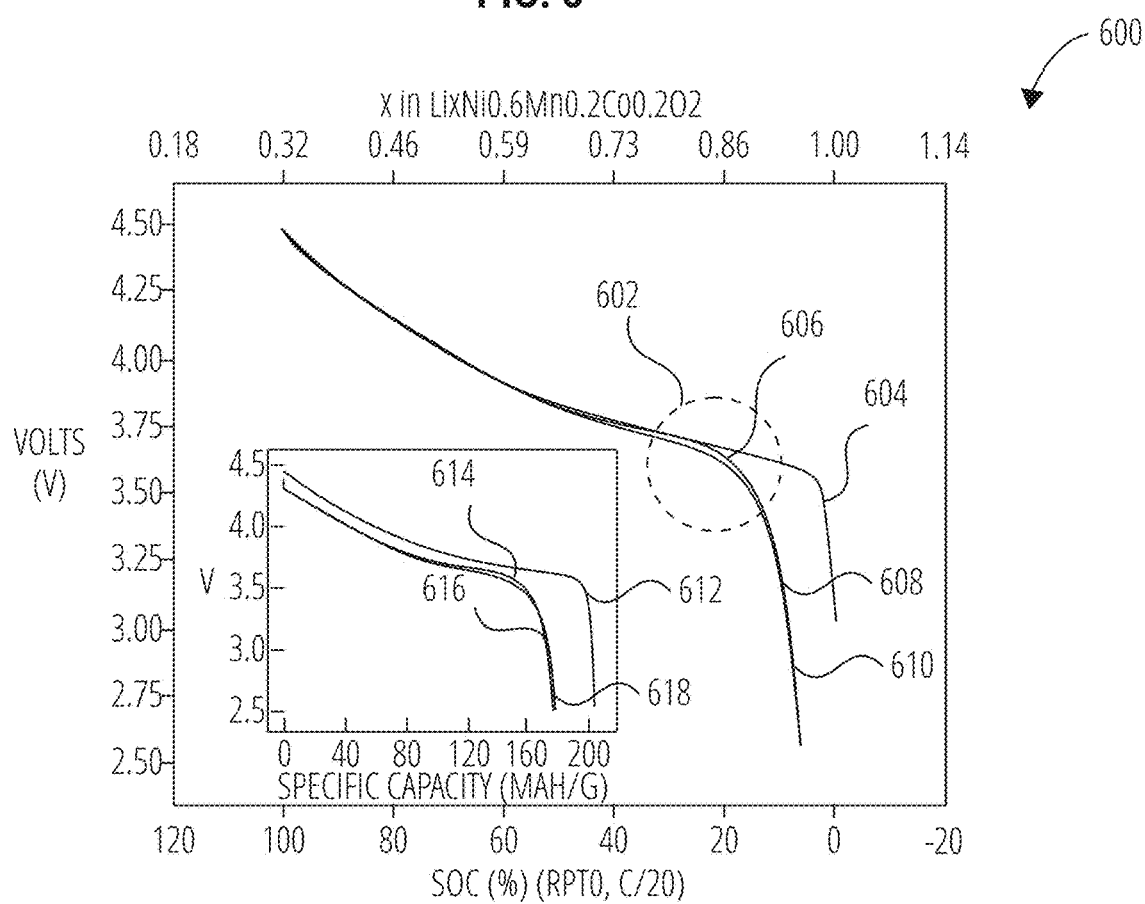
FIG. 6 is a cycle 25 discharge profile plot illustrating discharge curves for the three representative cells of FIG. 5 at 25 cycles of aging.
Figure 7:
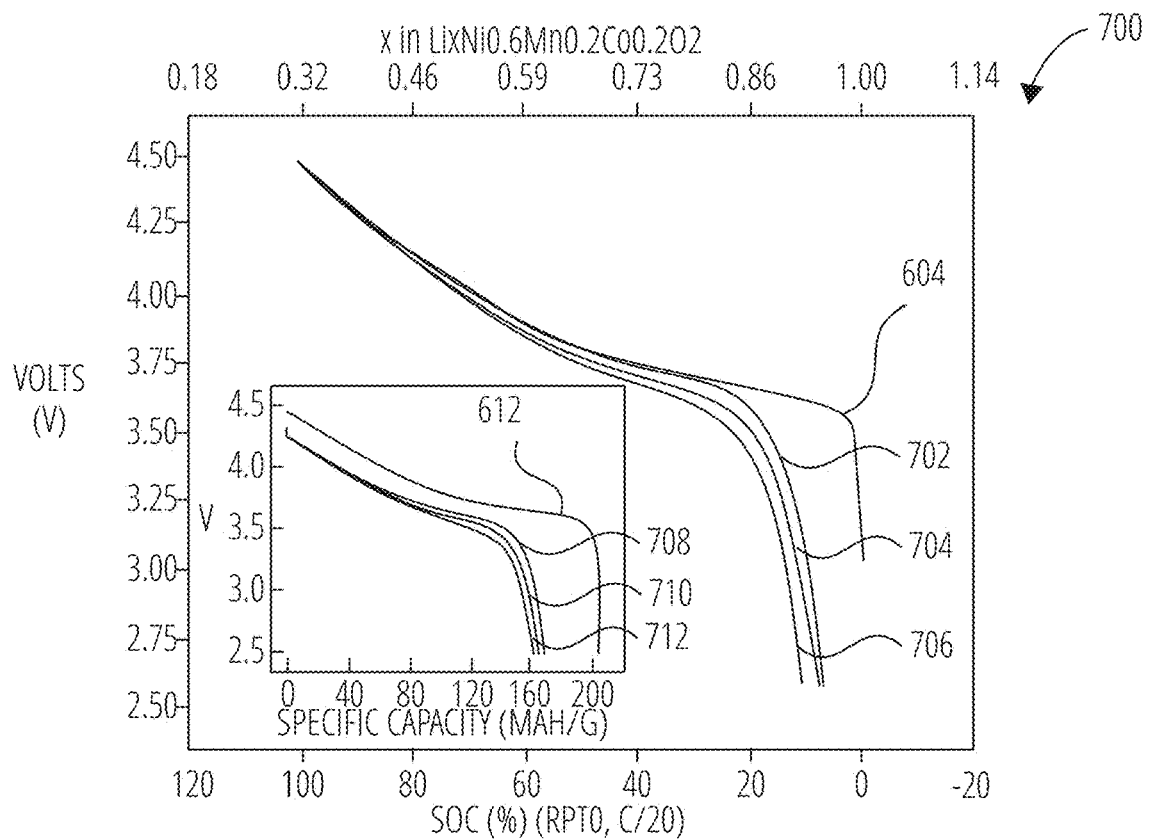
FIG. 7 is a cycle 45 discharge profile plot illustrating discharge curves for the three representative cells of FIG. 5 at 45 cycles of aging.
Figure 8:
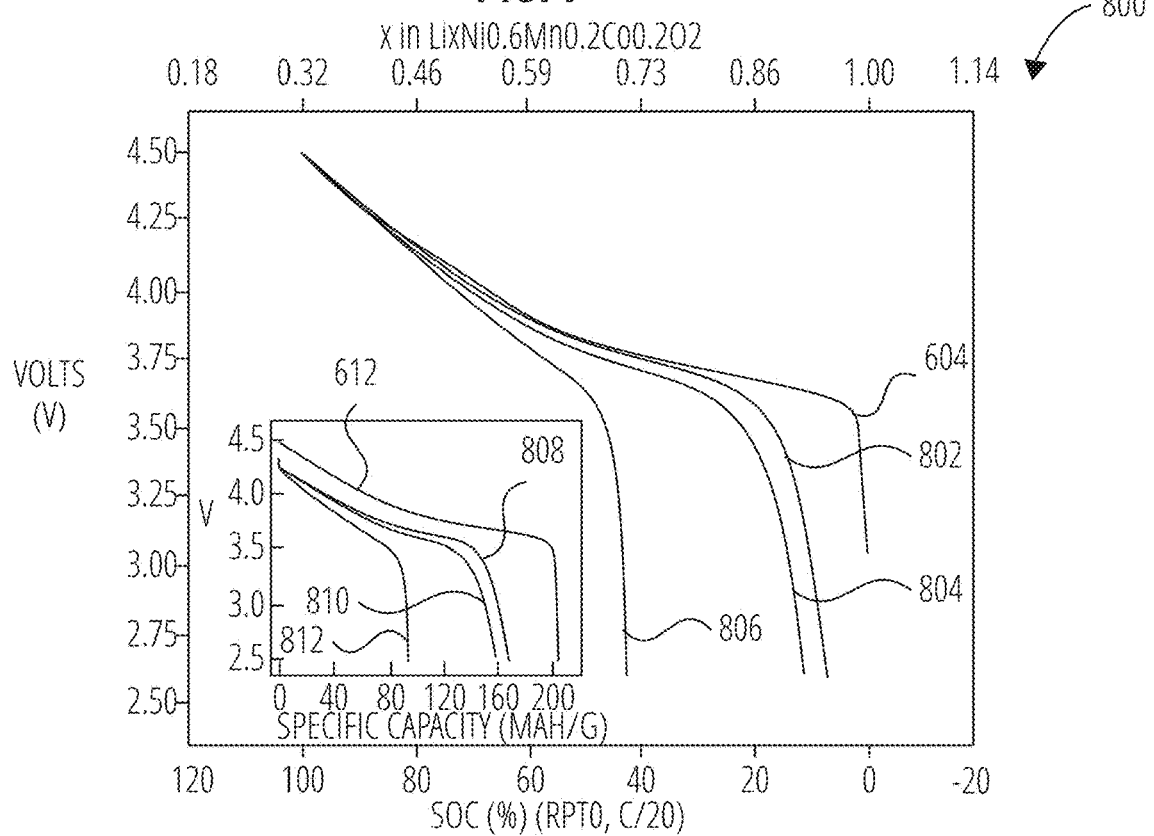
FIG. 8 is a cycle 50 discharge profile plot illustrating discharge curves for the three representative cells of FIG. 5 at 50 cycles of aging.

FIG. 6, FIG. 7, and FIG. 8 illustrate the eCAD-based FMEA results. Specifically, FIG. 6 includes eCAD-based analytic discharge curves (universal pseudo-OCV-SOC curve 604, cell 7 ("good") cycle 25 analytic discharge curve 606, cell 3 ("bad") cycle 25 analytic discharge curve 608, and cell 8 ("ugly") cycle 25 analytic discharge curve 610)

along with the corresponding experimental discharge curves at C/3 in the inset (experimental discharge curve 612 (measured at C/20), cell 7 ("good") cycle 25 experimental discharge curve 614 (measured at C/3), cell 3 ("bad") cycle 25 experimental discharge curve 616 (measured at C/3), and cell 8 ("ugly") cycle 25 experimental discharge curve 618 (measured at C/3)); FIG. 7 includes eCAD-based analytic discharge curves (universal pseudo-OCV-SOC curve 604, cell 7 ("good") cycle 45 analytic discharge curve 702, cell 3 ("bad") cycle 45 analytic discharge curve 704, and cell 8 ("ugly") cycle 45 analytic discharge curve 706) along with the corresponding experimental discharge curves at C/3 in the inset (experimental discharge curve 612, cell 7 ("good") cycle 45 experimental discharge curve 708, cell 3 ("bad") cycle 45 experimental discharge curve 710, and cell 8 ("ugly") cycle 45 experimental discharge curve 712); and FIG. 8 includes eCAD-based analytic discharge curves (universal pseudo-OCV-SOC curve 604, cell 7 ("good") cycle 50 analytic discharge curve 802, cell 3 ("bad") cycle 50 analytic discharge curve 804, and cell 8 ("ugly") cycle 45 analytic discharge curve 806) along with the corresponding experimental discharge curves at C/3 in the inset (experimental discharge curve 612, cell 7 ("good") cycle 50 experimental discharge curve 808, cell 3 ("bad") cycle 50 experimental discharge curve 810, and cell 8 ("ugly") cycle 50 experimental discharge curve 812). These analytic discharge curves revealed diverse behaviors in the charge retention and cycle life. At Cycle 25, FIG. 5 illustrates that the three cells behaved quite consistently in charge retention during the first 25 cycles of aging at C/3.

FIG. 6 is a cycle 25 discharge profile plot 600 illustrating discharge curves for the three representative cells of FIG. 5 at 25 cycles of aging. The universal pseudo-OCV-SOC curve 604 derived from the averaging of the C/20 charge and discharge curves is shown in each of the cycle 25 discharge profile plot 600 of FIG. 6, the cycle 45 discharge profile plot 700 of FIG. 7, and the cycle 50 discharge profile plot 800 of FIG. 8 to provide a baseline for comparison with the change of cell voltage as a function of Li content in the NMC cathode. Using the eCAD-based cell 7 ("good") cycle 25 analytic discharge curve 606 as an example, FIG. 6 illustrates that when SOC>30%, the cell $V_{IR\text{-}free}$ was closely aligned with the universal pseudo-OCV-SOC curve 604 as a function of SOC. Thus, the portion of the eCAD-based cell 7 ("good") cycle 25 analytic discharge curve 606 (i.e., the $V_{IR\text{-}free}$ vs. SOC curve) was closely aligned with the universal pseudo-OCV-SOC curve 604 above 30% SOC. This observation indicates that from the beginning of discharge (BOD) to near 30% SOC, the reaction kinetic pathway continues to follow the one defined by the thermodynamics. Only when the cell reached below 30% SOC, additional polarization-induced effect began to the performance of the cells apart—this is referred to herein as the so-called "KPH effect."

With careful examination, it is also noted that some differences in the KPH effect were already being deciphered in Cell #3 (bad) and Cell #8 (ugly) by eCAD, as highlighted by the KPH effect marker 602 in FIG. 6. The separation of $V_{IR\text{-}free}$ (e.g., the cell 7 ("good") cycle 25 analytic discharge curve 606, the cell 3 ("bad") cycle 25 analytic discharge curve 608, and the cell 8 ("ugly") cycle 25 analytic discharge curve 610) and pseudo-OCV (the universal pseudo-OCV-SOC curve 604) occurred at a higher SOC than 30% SOC (likely near 40% SOC) in both cases. The early detection of such disparity in the "KPH effect," even though quite subtle but noticeable, could be beneficial for cell qualification screening in the cell production and battery system integration.

FIG. 7 is a cycle 45 discharge profile plot 700 illustrating discharge curves for the three representative cells of FIG. 5 at 45 cycles of aging. At cycle 45, as the charge retention showed more noticeable differences among the three cells, the eCAD-based analytic discharge curves revealed how they depart, as illustrated in FIG. 7. Cell #7 continued to follow the same linear QF progression in charge retention (see the cell 7 ("good") cycle 45 analytic discharge curve 702), whereas cells #3 and #8 began to exhibit non-linearity (as shown in FIG. 5) (see the cell 3 ("bad") cycle 45 analytic discharge curve 704 and the cell 8 ("ugly") cycle 45 analytic discharge curve 706). Comparing FIG. 6 and FIG. 7, the "KPH effect" in Cell #7 continued to grow (i.e., the NMC-622 capacity continued to be progressively under-utilized) and occur at a higher SOC cycle by cycle at C/3 (at cycle 45, this onset of the separation of $V_{IR\text{-}free}$ (cell 7 ("good") cycle 45 analytic discharge curve 702) and pseudo-OCV (universal pseudo-OCV-SOC curve 604) is roughly around 40% SOC at cycle 45 versus 30% at cycle 25).

In contrast, the eCAD-based analytic discharge curves of cells #3 and #8 showed a different behavior from that of Cell #7, as highlighted in FIG. 7. Both cell #3 and cell #8 showed an early departure of $V_{IR\text{-}free}$ (cell 3 ("bad") cycle 45 analytic discharge curve 704, cell 8 ("ugly") cycle 45 analytic discharge curve 706) from pseudo-OCV (universal pseudo-OCV-SOC curve 604) from BOD. The separation between $V_{IR\text{-}free}$ and pseudo-OCV increased with SOC in the course of discharging. Such a behavior is different from the KPH effect observed in Cycle 25 (FIG. 6). There is no reason to assert that this increasing separation between $V_{IR\text{-}free}$ and pseudo-OCV in polarization as a function of SOC is due to NMC active material or its deterioration in reaction kinetics (activity). It is because the NMC in the seven good cells has behaved consistently very stable. This effect was also recurring cycle by cycle at BOD (whereas the SOC at BOC varies from cycle to cycle to a slightly lower value). No literature reports discussed such kinetic retardation of NMC activity during cycle aging to date. The amount of $QF_{LAM}$ may be insignificant to create such an effect. As this effect was recurring and it became worse cycle with by cycle, it is suspected that this increasing polarization with SOC is from the LME anode.

FIG. 8 is a cycle 50 discharge profile plot 800 illustrating discharge curves for the three representative cells of FIG. 5 at 50 cycles of aging. At cycle 50, the onset of the separation of $V_{IR\text{-}free}$ (cell 7 ("good") cycle 50 analytic discharge curve 802) and pseudo-OCV (universal pseudo-OCV-SOC curve 604) in cell #7 has been increased to about 45% SOC, as illustrated in FIG. 8. Cell #3 exhibited a growing impact from the polarization increase at LME, even though the capacity did not suffer a significant loss, compared to that of cell #7. The most serious degradation was shown in cell #8, which suffered a substantial QF that seems much beyond the degree anticipated from the KPH effect. In other words, the drastic increase in QF in cell #8 from cycle 45 to cycle 50 is quite disproportional to the increase of LME polarization with SOC (i.e., if one followed the same trend as projected from cells #7 and #3). Therefore, the dramatic QF around 45% SOC may be the result of shortage in Li inventory in addition to or instead of LME polarization. The failure of cell #8 reveals the transition of failure modes from increasing LME polarization to the shortage of Li inventory.

Accordingly, it is presumed that a sustainable integrity with NMC enabled identification of the issues with the LME anode.

Figure 9:
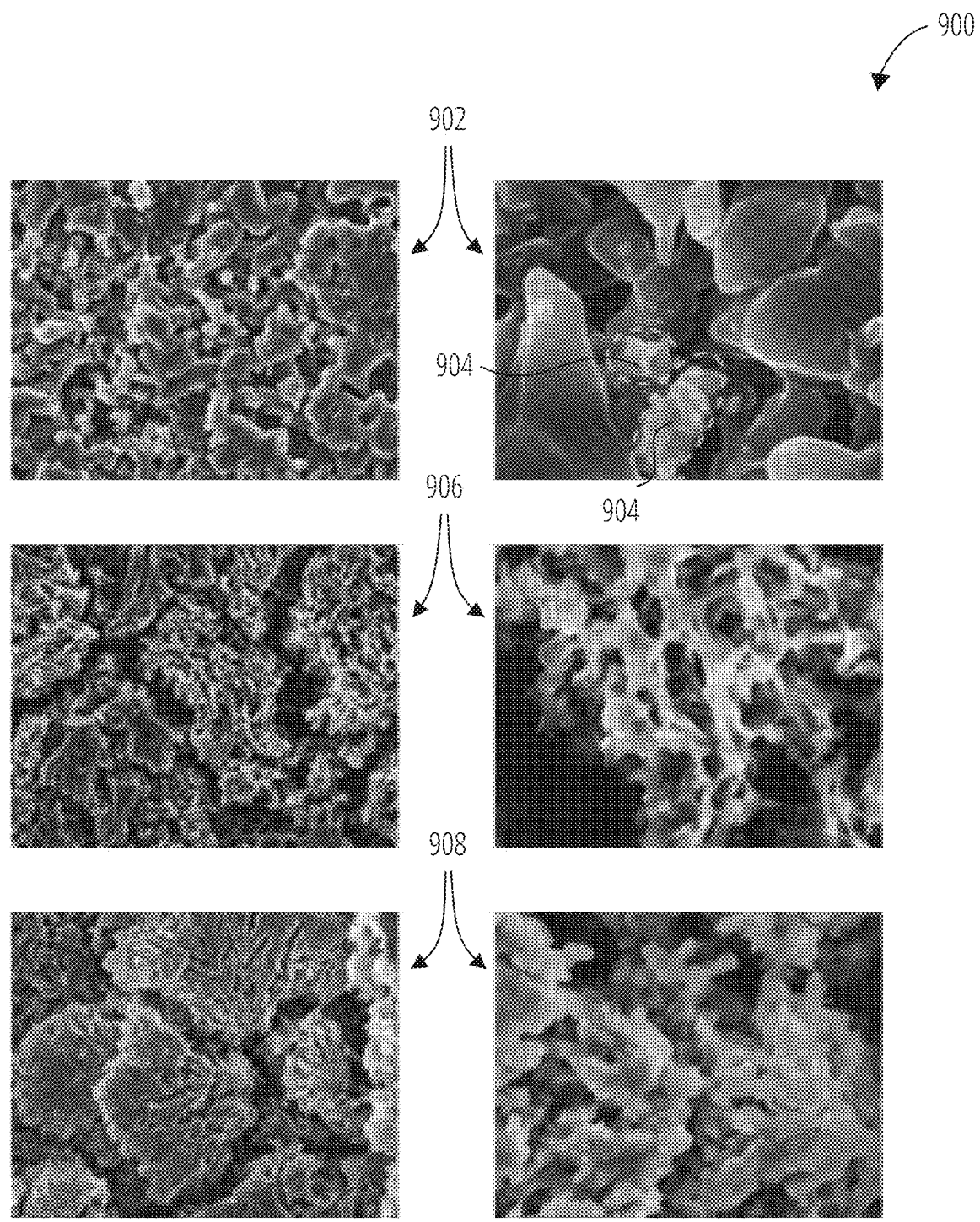
FIG. 9 illustrates scanning electron microscope (SEM) micrographs showing morphological changes of the Li anode in the three representative cells of FIG. 5 at the end of the cycle aging.

Interestingly, the failure at the LME from increasing polarization to the shortage of Li inventory could be further supported by evidence in SEM micrographs (e.g., SEM micrographs 900 of FIG. 9) obtained from the spent LME of these three cells at the end of RPT-2 when the cells were fully discharged, as shown in FIG. 9.

FIG. 9 illustrates SEM micrographs 900 showing morphological changes of the Li anode in the three representative cells of FIG. 5 at the end of the cycle aging. Specifically, the SEM micrographs 900 illustrate representative cell 7 ("good") surface morphology 902, cell 3 ("bad") surface morphology 906, and cell 8 ("ugly") surface morphology 908 spent LME anodes. The cell 7 ("good") surface morphology 902 manifests platelet morphology, homogeneous stripping of Li-good reversibility, and relatively little inactive (dead) Li. The cell 3 ("bad") surface morphology 906 manifests sponge morphology and high porosity with deep pits and trenches. Charging effect is indicative of inactive Li (dead Li), implying much increased electrolyte consumption from that of good cells (e.g., the cell 7 ("good") surface morphology 902). The cell 8 ("ugly") surface morphology 908 manifests coral reef-like morphology with high content of inactive Li and heavy SEI coating, which indicates limited Li inventory to generate useful capacity.

Reversible Li stripping and deposition is key to the excellent charge retention in the good cells. Such reversibility is suggested by the presence of the smooth surface of the Li grains in LME of the cell 7 ("good") surface morphology 902. However, in certain portions 904 of the LME (as circled using broken lines), some "inactive" or "dead Li" pieces were also found. This is evident by the surface charging effect (brighter contrast) by the e-beam, due to the presence of thicker SEI (known to be electronically insulating layer) on these "dead Li" pieces. The "tortuous" surface of these "dead Li" pieces also suggests that they were likely created by pitting due to uneven Li stripping and current density distribution. As cycle aging continues, the amount of "dead Li" continues to grow and accumulate on the surface of LME. Meanwhile, the active surface area available for Li stripping could be reduced as a consequence. This mechanism may induce further increase in unevenness of current density distribution and stripping.

Such a vicious cycle in the evolution of the surface morphology, accompanied with increasingly more strenuous Li deposition and stripping, lead to the non-linear QF in the bad cells and the resulting cell 3 ("bad") surface morphology 906 on the spent LME as shown in FIG. 9. At this stage, strips of "dead Li" now cover the surface, leaving voids (e.g., where Li was stripped away for the intercalation in the NMC) going deeper into the LME bulk like trenches.

In the cell 8 ("ugly") surface morphology 908 the spent LME of the ugly cell is now packed with a substantial portion of "dead Li" on the surface, whereas the proportion of the voids where active Li was stripped away is much reduced. Thus, the disproportional amount of void space left behind by Li stripping on the spent LME at the end of discharge suggests the amount of active Li is very limited for intercalation as evident by the serious capacity fade.

The implications from these SEM micrographs 900 corroborate suspicions on the LME performance and its impact on charge retention. Preferential Li stripping resulted in a diverse, unpredictable supply of active Li that created significant variability in charge retention and cycle life among the cells in the same build, even though they behaved quite consistently in the beginning of life.

TABLE 1 details quantification of capacity fade (QF) attributes from the quantitative eCAD-based FMEA for the representative cell 7 ("good"), cell 3 ("bad"), and cell 8 ("ugly") in the discharge regime. All Q and QF in Table 1 are expressed in mAh g$^{-1}$.

| Cycle | Capacity, Q | QF$_{LAM}$ | QF$_{IR}$ | QF$_{KPH}$ |
|---|---|---|---|---|
| Good, Cell 7 | | | | |
| RPT-0 (C/20) | 204.52 | 0.00 | — | — |
| Cycle 1 | 189.90 | 0.26 | 14.36 | 0.00 |
| Cycle 5 | 187.61 | 1.32 | 14.36 | 1.24 |
| Cycle 10 | 185.31 | 2.64 | 14.36 | 2.21 |
| Cycle 15 | 183.02 | 3.97 | 14.36 | 3.18 |
| Cycle 20 | 180.81 | 5.29 | 14.36 | 4.07 |
| Cycle 25 | 178.51 | 6.61 | 14.36 | 5.04 |
| RPT-1 (C/20) | 197.38 | 7.14 | — | — |
| Cycle 26 | 177.15 | 7.32 | 14.36 | 5.70 |
| Cycle 30 | 175.28 | 8.02 | 14.36 | 6.86 |
| Cycle 35 | 172.99 | 8.90 | 14.36 | 8.28 |
| Cycle 40 | 170.44 | 9.78 | 14.36 | 9.95 |
| Cycle 45 | 168.23 | 10.67 | 14.36 | 11.27 |
| Cycle 50 | 166.27 | 11.55 | 14.36 | 12.35 |
| RPT-2 (C/20) | 192.62 | 11.90 | — | — |
| Bad, Cell 3 | | | | |
| RPT-0 (C/20) | 203.16 | 0.00 | — | — |
| Cycle 1 | 188.63 | 0.26 | 14.27 | 0.00 |
| Cycle 5 | 185.50 | 1.13 | 14.27 | 1.26 |
| Cycle 10 | 183.95 | 2.27 | 14.27 | 2.67 |
| Cycle 15 | 181.74 | 3.40 | 14.27 | 3.75 |
| Cycle 20 | 179.53 | 4.53 | 14.27 | 4.83 |
| Cycle 25 | 177.15 | 5.67 | 14.27 | 6.07 |
| RPT-1 (C/20) | 197.04 | 6.12 | — | — |
| Cycle 26 | 176.39 | 6.30 | 14.27 | 6.21 |
| Cycle 30 | 173.84 | 7.02 | 14.27 | 8.04 |
| Cycle 35 | 171.37 | 7.92 | 14.27 | 9.60 |
| Cycle 40 | 168.57 | 8.82 | 14.27 | 10.98 |
| Cycle 45 | 164.31 | 9.72 | 14.27 | 12.32 |
| Cycle 50 | 157.26 | 10.62 | 14.27 | 13.66 |
| RPT-2 (C/20) | 180.04 | 10.98 | — | — |
| Ugly, Cell 8 | | | | |
| RPT-0 (C/20) | 203.67 | 0.00 | — | — |
| Cycle 1 | 191.18 | 0.26 | 12.23 | 0.00 |
| Cycle 5 | 187.86 | 0.94 | 12.23 | 2.64 |
| Cycle 10 | 185.57 | 1.89 | 12.23 | 3.99 |
| Cycle 15 | 183.36 | 2.83 | 12.23 | 5.25 |
| Cycle 20 | 181.06 | 3.78 | 12.23 | 6.60 |
| Cycle 25 | 178.68 | 4.72 | 12.23 | 8.04 |
| RPT-1 (C/20) | 198.57 | 5.10 | — | — |
| Cycle 26 | 177.49 | 5.28 | 12.23 | 8.67 |
| Cycle 30 | 175.03 | 6.00 | 12.23 | 10.42 |
| Cycle 35 | 172.22 | 6.90 | 12.23 | 12.32 |
| Cycle 40 | 168.40 | 7.80 | 12.23 | 13.58 |
| Cycle 45 | 160.66 | 8.70 | 12.23 | 15.24 |
| Cycle 50 | 92.15 | 9.90 | 12.23 | 16.91 |
| RPT-2 (C/20) | 103.79 | 9.96 | — | — |

Charge retention of 14 rechargeable Li||NMC-622 cells of the same build was shown in FIG. 1 and classification of the 14 cells into good, bad, and ugly classes was performed based on performance in cycle aging. Electrochemical analytic diagnosis (eCAD)-based failure mode and effect analysis (FMEA) on three sample cells, one from each class, was illustrated. It was shown that cell qualification may be reliably achieved by this method based on thermodynamic state of charge (SOC) determination. Precise and accurate quantification of capacity fade (QF) attributes may be achieved. Such quantification may separate (1) the loss of active materials (QF$_{LAM}$)—a thermodynamic attribute—from those that cause under-utilization of the active material (QF$_{UAM}$) in the electrodes—kinetic attributes—due to (2)

reduction in capacity ($QF_{IR}$) by rate-dependent, IR-induced polarization and (3) deterioration from kinetic polarization hindrance ($QF_{KPH}$). It was discovered that very consistent, well-behaving Li metal cells in the same build could exhibit very diverse charge retention and cycle life results. Such a significant diversity and variability in cycle life is a result of uneven, preferential Li stripping, "dead Li" formation, and surface morphology evolution on Li metal electrode (LME) in cycle aging as revealed by eCAD-based FMEA and SEM micrographs of the spent LME at the end of cycle aging in these cells. The interplay of these phenomena resulted in a diverse distribution of Li inventory that greatly affects charge retention and cycle life during cycle aging. Using this quantitative eCAD-based FMEA, a unique cell qualification method according to embodiments disclosed herein was demonstrated.

Figure 10:
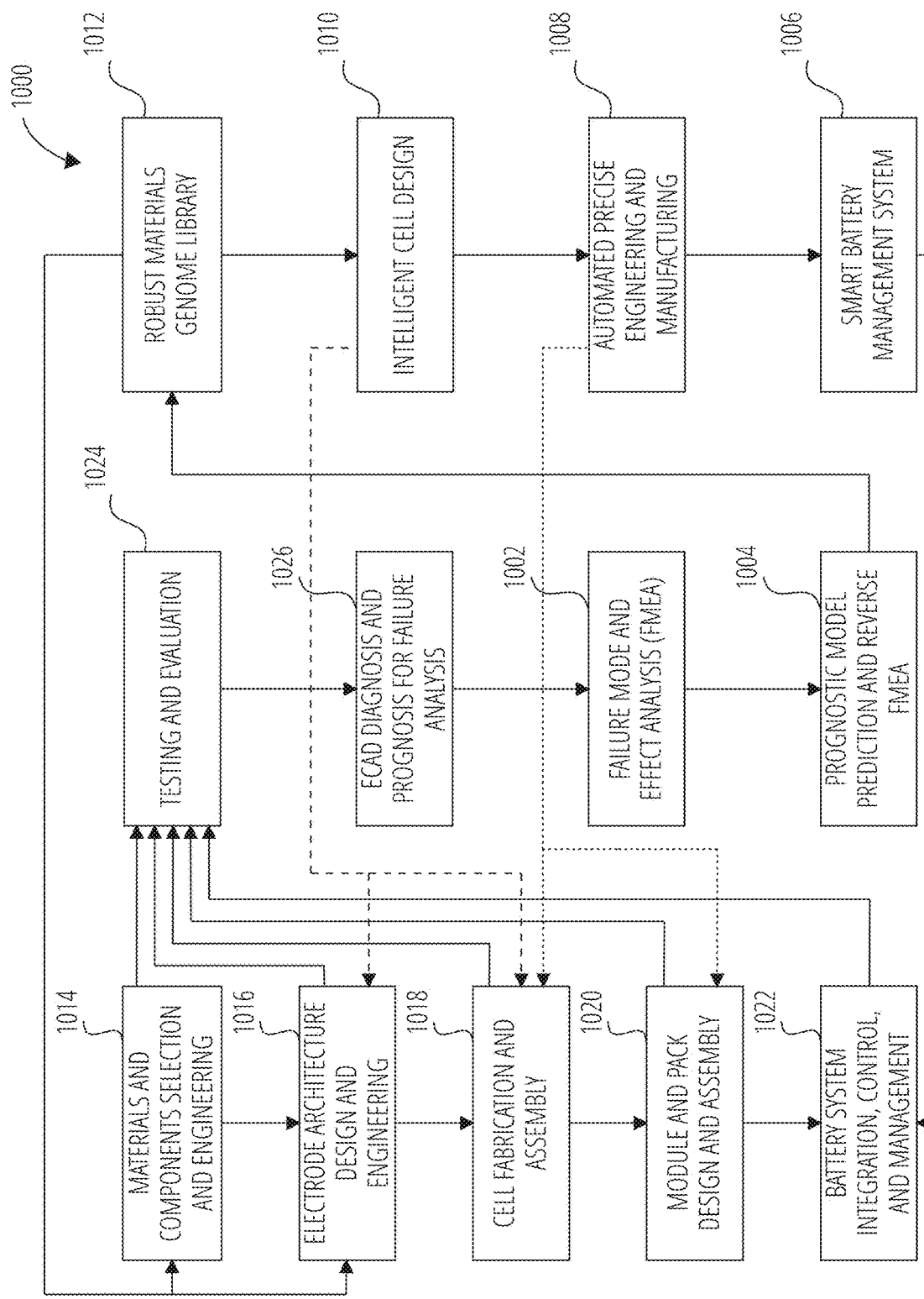
FIG. 10 is an integration flow diagram illustrating integration of battery cells from materials to system integration, according to some embodiments, and how embodiments disclosed herein may enable advanced reverse failure model and effect analysis and prognostic predictive model analysis.

FIG. 10 is an integration flow diagram 1000 illustrating integration of battery cells from materials to system integration, according to some embodiments, and how embodiments disclosed herein may enable advanced reverse failure model and effect analysis and prognostic predictive model analysis. The integration flow diagram 1000 includes materials and components selection and engineering 1014, electrode architecture design and engineering 1016 for cell fabrication and assembly 1018, module and pack design and assembly 1020, battery system integration, control, and management 1022, testing and evaluation 1024, eCAD diagnosis and prognosis for failure analysis 1026, FMEA 1002, prognostic model prediction and reverse FMEA 1004, robust materials genome library 1012, intelligent cell design 1010, automated precise engineering and manufacturing 1008, and smart battery management systems 1006.

The integration flow diagram 1000 may flow from the materials and components selection and engineering 1014 to electrode architecture design and engineering 1016, to cell fabrication and assembly 1018, to module and pack design and assembly 1020, and to battery system integration, control, and management 1022. The integration flow diagram 1000 may also flow from any of the materials and components selection and engineering 1014, electrode architecture design and engineering 1016, cell fabrication and assembly 1018, module and pack design and assembly 1020, and battery system integration, control, and management 1022 to testing and evaluation 1024. The flow diagram 1000 may also flow from testing and evaluation 1024 to eCAD diagnosis and prognosis for failure analysis 1026 to FMEA 1002, to prognostic model prediction and reverse FMEA 1004, to robust materials genome library 1012, to intelligent cell design 1010, to automated precise engineering and manufacturing, and to smart battery management system 1006.

The integration flow diagram 1000 may also flow from robust materials genome library 1012 to materials and components selection and engineering 1014 and/or electrode architecture design and engineering 1016. The integration flow diagram 1000 may further flow from intelligent cell design 1010 to electrode architecture design and engineering 1016 and/or cell fabrication and assembly 1018. The integration flow diagram may additionally flow from automated precise engineering and manufacturing 1008 to cell fabrication and assembly 1018 and/or module and pack design and assembly 1020. Furthermore, the integration flow diagram 1000 may flow from smart battery management system 1006 to battery system integration, control, and management 1022.

The robust materials genome library 1012 may, among other things, include use of advanced electrolyte models, multi-scale electrode design models, computation materials phase diagrams, and other tools. The robust materials genome library 1012 may consider cell fabrication and assembly 1018, electrode architecture design and engineering 1016, and active materials properties. The intelligent cell design 1010 may, among other things, include use of enhanced understanding of cell design, identification of Li failure, improvement of performance, cell performance and failure analysis, electrode architecture and variability, and active materials properties and interactions. The automated precise engineering and manufacturing 1008 may, among other things, include use of application-specific design goals and failure analysis, cell performance and failure analysis, electrode architecture and variability, and active materials properties and interactions. The smart battery management system 1006 may, among other things, include use of performance and failure variabilities and cell performance and failure analysis.

FIG. 10 illustrates the unique concept that can provide a critical system engineering approach to enable battery integration and management. Growth of capabilities in battery diagnostics and prognostics enables failure mode and effect analysis (FMEA). Information gathering also allows development of a unique reverse engineering capability to conduct failure analysis from the system level to the sub-component and materials level to decipher where failure occurs and what issues need to be resolved. This is a quantitative approach to allow better engineering to solve design requirements and overcome technical barriers related to performance, durability, reliability and safety. This approach applies to both vehicle platform and energy storage applications.

FIG. 10 delineates a philosophical approach of how FMEA may incorporate the AI-ML based approach to enable intelligent control of the LIBESS performance and to achieve durability, reliability, and safety. In contrast to conventional manufacturing approaches from materials to system integration, the FMEA concept of FIG. 10 is a holistic approach from system failure analysis down to materials, where significant effort in validating performance data and failure mode would involve. It is also noted that this FMEA methodology is different from conventional approaches performed in the industry, which is often qualitative to find root cause but not quantitative to be used for in-line diagnostics and prognostics as is proposed herein.

FIG. 10 also delineates what capabilities may advance the battery diagnostic and prognostic capabilities and FMEA. Embodiments disclosed herein should present strong impacts to the future battery technology development.

The integration flow diagram 1000 of FIG. 10 illustrates a battery diagnostic and prognostic (BDP) capability using advanced data-driven, machine-learning-based validation to drive intelligent design, manufacturing, and system engineering integration approach. In contrast to conventional battery manufacturing that is based on "materials to system integration and design," this BDP and FMEA approach is a "system failure analysis from system down to all components, including materials." To realize such a capability, a big-data, high performance computing (HPC)-enabling and AI-ML-based analytics may be used.

This unique BDP capability and the associated analytics can be summarized in the following technical areas:
  Principle-based state-of-charge (SOC) and state-of-health (SOH) determination and model
  Cell variability study and analysis
  Cell degradation and failure analysis
  Cell to pack integration and analysis Degradation mechanisms and path dependence identification Embodiments disclosed herein provide a platform to integrate these areas of knowledge into a validated toolbox and approach to support programs and other needs in the industry.

Figure 11:
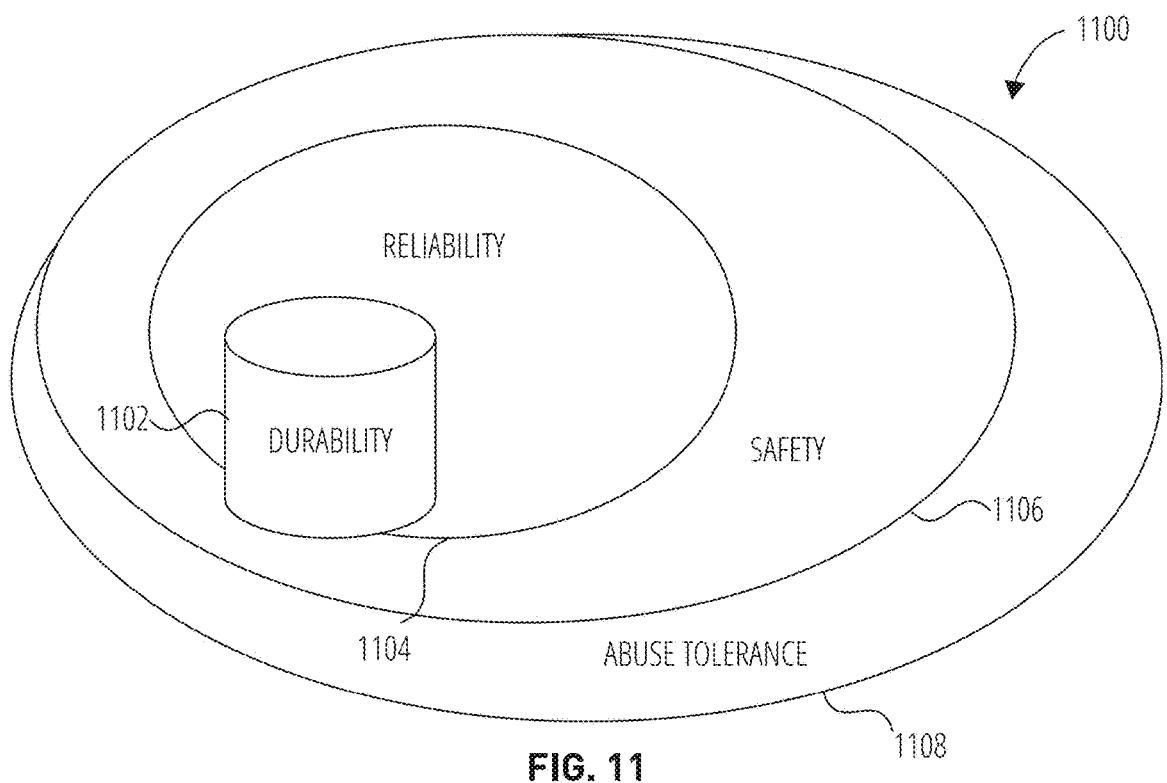
FIG. 11 is a perspective on durability, reliability, safety, and abuse tolerance for a chemical system such as a battery.

FIG. 11 is a perspective 1100 on durability 1102, reliability 1104, safety 1106, and abuse tolerance 1108 for a chemical system such as a battery. The durability 1102 may be for a system device and may involve manuals for installation and/or operation. The reliability 1104 may involve environmental factors such as mechanical factors, electrical factors, thermal factors, and chemical factors, and may involve policies and regulations such as protocols and procedures and control management and auditing. The safety 1106 may involve human factors such as duty cycle and schedule, frequency, preference, and habit, and may involve education, training and enforcement. Abuse tolerance 1108 may involve catastrophic events.

As previously discussed, rechargeable lithium batteries (RLB), including Lithium-ion batteries (LIB), are accelerating the electrification of the transportation sector and the application of energy storage systems for the electrical grid. This critical transformation of the transportation and energy sector shall bring more clean energy into daily life. The RLB technology is progressing at a pace of noticeable market acceptance due to increasingly reduced cost and improved durability, reliability, and safety. Nonetheless, the safety-related issues with the use of RLB remain as a valid concern due to the nature of high energy density of RLB. Another concern of limited resource of critical materials to sustain the use of RLB also escalates. Reuse and recycle of the RLB to extend the useful life and recover the critical materials of RLB become important topics. Disclosed herein is a critical review of these topics.

Rechargeable lithium batteries (RLB), and more particularly lithium-ion batteries (LIB) with their high energy density and power capability, are accelerating the transformation of human life in using microelectronics and power tools and adoption of vehicle electrification and power grid modernization. It is also important to recognize a significant aspect of this vital transformation that RLB free the availability of electrons from stationary outlets to mobile devices that substantially increases the degree of freedom in mobility.

To sustain this transformation, cost and performance are two metrics to incentivize the market acceptance. Today, the LIB's initial installation cost could be down to $75/kWh at the cell level and $100/kWh in the pack for vehicle propulsion. For energy storage, $50/kWh level or below may be a realistic goal. However, the cost of the entire life cycle remains less definitive because many risk factors associated with durability 1102, reliability 1104, and safety 1106, and costs to mitigate them are not well determined. To further reduce the costs of the battery supply chain, managing the availability of the critical materials used in the LIB/RLB, enabling effective manufacturing, and improving performance are emerging goals.

To manage the resources of critical materials there are a few options, including searching for proper replacements with more plentiful ones to relieve the constraints, extending the useful life of LIB/RLB, incorporating the possibility of re-purpose and re-use, or realizing the recycle and recovery of the materials.

To enable more advanced manufacturing and performance, applying quantifiable and verifiable knowledge to address critical eco-technical issues and barriers related to durability, reliability, and safety will be useful. Such quantifiable and verifiable knowledge is traditionally acquired by engineering optimization in the "design-build-test" paradigm. Using design of experiments which is built upon the specification, the battery design and engineering team select proper materials, develop suitable processing factors and conditions, build prototypes, and test the sample cells to validate the cell design for mass production. This development cycle is iterative; thus, it is time consuming, labor intensive, and mostly empirical in nature. The knowledge accrued from this practice is often not applicable to a new specification or cell design due to the lack of accuracy in predictability and verifiability. The drawbacks of this practice include the lack of traceability to defects that could come from material's quality, design flaw, manufacturing control, and user abuse, even though one could argue that these problems can be managed through better practice and tightened control as the technology becomes more mature. This argument cannot avoid the reality that the accrued knowledge is likely tied to design specifics. Therefore, this type of empirical approach will inhere the problem that a generalized prediction for different designs or operating conditions that can bear desired accuracy would be likely difficult unless a sufficiently large database is available. This is a frustrating process and an inefficient way to advance the technology. This is an emphasized concept of embodiments disclosed herein relying on quantifiable and verifiable knowledge, which is derived using basic principles verified as independent of variations in system design or operating condition, to enable advanced LIB/RLB research and development.

Furthermore, a substantial part of the failures with durability, reliability, and safety in LIB/RLB are originated from localized phenomena that trigger unintended catastrophic consequences. These localized phenomena are difficult to detect in early stage of life of LIB/RLB. Therefore, building failure mode and effect analysis (FMEA)-based diagnosis and prognosis capability for the entire supply chain of LIB/RLB could be a vital and feasible approach to mitigate the risks. This approach could improve the life cycle cost and performance of the LIB/RLB significantly.

Therefore, embodiments disclosed herein consider the feasibility and viability of conducting failure analysis (FA) and FMEA in a quantitative manner to address LIB/RLB cost and performance aspects. Embodiments disclosed herein apply quantitative FMEA to battery supply chain to identify risks of failure associated with durability, reliability, and safety; quantify the effect and impact of the failure modes; and, verify if any improvement or solution to mitigate a hazard could create the anticipated results. Proposed herein is a quantifiable and verifiable knowledge-based concept that is built upon a verified model, which includes basic principles derived from the diagnostics that can generate predictable results of desired accuracy and precision to enable prognosis. This concept is less dependent on empirical correlations that are sensitive to design specifications (e.g., the amount of materials used; the architectural details of electrode; the cell's shape, geometry, and size; or the process conditions) than conventional approaches; the operating environment, condition, and schedule; or, user's habit and abuse. Utilizing knowledge base with sufficient predictability and verifiability may allow managing of critical materials resources, developing efficient manufacturing capability, and improving battery performance with market-worthy durability, reliability, and safety.

The LIB supply chain could be briefly described in three key sectors: portable microelectronic devices and tools, powertrain for vehicle applications, and stationary energy storage systems. Requirements in functionality drive the battery design, cost bearing, and performance characteristics in a different manner among the three sectors. Such divides also significantly impact the choice of chemistry, selection of materials, architecture of electrodes, design and configuration of the cells, complexity in the manufacturability, control of the product quality, condition of operation, and other cost and performance factors.

In anticipation of a substantial growth in battery-powered electric vehicles and energy storage systems, the market could grow in double by 2025. The demands may pose a pressure on the supply side. For example, cobalt (Co) is a material used in LIB for consumer and vehicle applications, and its reserve and production in a handful of countries such as Republic of Congo has posed concerns of the supply issue and the impact on cost. Reducing Co use in the positive electrode composition has been an effort for research to seek alternatives. Recovery and recycle of Co in the waste stream is also favorably pursued by the LIB industry. Although lithium (Li) supply and reserve has not been an issue, maintaining an affordable level in supply and recovery of Li should be seriously considered in sustaining the Li supply chain. The recycling and reuse of critical materials in the LIBs have been critically reviewed in a few recent articles, showing the importance of this subject matter.

Remanufacturing costs have been estimated to be about 60% of an original battery cost. Repurposing would be viable if the costs are between 44% and 55% of sales prices, ranging between $83/kWh and $114/kWh for 16-kWh Chevrolet Volt packs. If remanufacturing could be done by automatic disassembly, the cost would reach €119.74/kWh, which is still profitable given a selling price of €180/kWh. Cost breakdowns for remanufacturing include material handling and receiving, replacement material, labor, transportation, overhead, R&D, and capital cost of the plant. Repurposing costs have been estimated for PHEV LIBs such as a 3 kWh pack, an 8 kWh pack, and a 16 kWh pack at $744/pack, $1,150/pack, and $1,780/pack, respectively. Another study estimated repurposing costs of a 5-kWh pack at $25/kWh to $49/kWh, but this cost is highly dependent on the cost of used batteries which accounts for 45%-76% of total annual costs. Depending on which applications the repurposed LIBs are used for, in addition to transportation, material handling and receiving, R&D and capital costs, it is necessary to take into account the cost of installation, power condition, control, interface for bulk storage, accessories and shipping for load leveling and transmission deferral facility as well as operation and maintenance for the non-EV application. As a result, the economic viability of repurposing depends on the specific application.

The economics of recycling is more complicated than that of repurposing and remanufacturing due to battery chemistries, pre-processing, and recovery technologies. Among the three recycling methods of pyrometallurgy, hydrometallurgy and direct recycling, pyrometallurgy is the most economical and direct recycling is the least favorable. Major LIB recycling cost components include collection and transportation, depreciation cost of equipment, energy consumption, equipment maintenance, water consumption, labor cost and chemical/reagent cost. Based on this cost structure, when comparing among hydrometallurgical process for $LiCoO_2$ (LCO), $LiFePO_4$ (LFP) and $LiMn_2O_4$ (LMO), recycling profit of LCO is the highest whereas LFP is the lowest. Comparing direct recycling costs for $LiNi_xMn_yCo_zO_2$ (NMC), $LiNi_xCo_yAl_zO_2$ (NCA) and LFP batteries showed that at-scale relithiation cost of NMC and NCA is cheaper ($6/kg cathode) than LFP ($20/kg cathode). Fixed costs and variables costs have been estimated for different recycling facility locations such as US, Italy, Mexico, and Canada and Germany.

A tool for estimating recycling cost and environmental impacts has been developed for various battery chemistries, plant location and recycling methods based on user inputs. Yet, safety is frequently discussed when LIBs are handled for remanufacturing, repurposing and recycling. While safety cost is accounted for in material receiving & handling and transportation costs (as Class 9 hazardous material with a fuel surcharge), it is not clear if it is addressed during disassembly and further processing. In general, the safety-related cost is embedded in the costs of management in compliance with workplace environmental, health, and safety standards. In other words, the cost to maintain proper safety to handle LIBs are not well studied in the circular economy model. Embodiments disclosed herein consider characterizing types of safety and the range of cost incurred (either per operation, process, or unit of input materials).

Performance is considered as a cost factor to promote market acceptance. Taking specific energy as an example, the higher the specific energy the less amount of materials could be used to store the same amount of energy. As another example, the longer the cycle life the less the life cycle cost for the LIB could be. To date, using carbonaceous anode and LCO, NCA or NMC cathode, the LIBs could achieve a specific energy of 220-250 Wh/kg and energy density of 550-650 Wh/L with cycle life well above 1,000 cycles. If a Si-based anode were used, the specific energy could be over 300 Wh/kg, while cycle life might be compromised. If a Li metal anode were used, the specific energy could be even higher than 350 Wh/kg [7].

From a performance perspective, a high energy content could be achieved by either higher cell voltage or higher capacity than those of the current art. It is important to realize that Li, which possesses one of the most negative reduction potentials among all elemental species and very light atomic weight, is the ideal negative electrode for rechargeable batteries. Thus, the pursuit of Li metal anode and high-nickel content NMC cathodes is one of the best solutions so far. For cost cutting, a substantially increased cycle life for the LFP-based chemistry is an attractive alternative. Li—S chemistry could drive the cost even lower if a better utilization of S and long life could be achieved.

In the pursuit of newer design and chemistry, challenges arise in durability 1102, reliability 1104, and safety 1106. In such a pursuit, pushing material's limit in performance and functionality may face stringent requirements on accurate and precise control of material's properties. The conventional engineering approach using the empirical experimental control could face physical limitations as such that requirements of accuracy and precision become more stringent.

LIB/RLB is a very complicated electrochemical device and system where chemical, thermal, mechanical, and electrical energies are balanced at any point in time and across the entire spatial dimensions. Also, the force fields, phase fields, and the gradients from these four energies are often coupled and such coupling is not easy to be decoupled by experimental control. If there is a localized imbalance in any form of the energy or the force, the consequence will impact the performance of LIB/RLB and thus affecting durability 1102, reliability 1104, and safety 1106.

The above aspect echoes the need to focus on characterizing types of safety and the range of cost incurred in a more quantitative manner. In this context, embodiments disclosed herein emphasize that such characterizations should go beyond testing and applying empirical correlation for device engineering and process optimization, instead of just to pass the safety requirements and regulations. Conducting a holistic FA and applying the FMEA capability can be quantitative to assess and identify the risk factors that affect durability, reliability and safety in a verifiable manner. The FMEA quantification offers the potential to enable principles-based model prediction and verification.

The state-of-the-art FMEA-based diagnosis and prognosis of LIBs is not well applied in the field. One reason is techniques that can enable more identification and quantification of failure at root causes can only be achieved in the research laboratory, and its validity is not yet confirmed and well accepted by the industry as a standard practice.

Another issue is that the current practices tend to rely on tests and chemical and physical characterizations over a wide range of spatial and temporal scales, lacking a verifiable correlation with globally measured electrochemical response. For example, quantitative measurements with spectroscopic and microscopic analyses can be applied to a finite volume or surface area in the material, electrode, or the cell. Therefore, much localized data on crystal lattice structure, surface morphology, and composition of the material can be quantified. However, the body of knowledge cannot be applied to the global observations, such as the voltage and current of the battery used to define the performance metric, in a quantitative and predictable manner.

A broader perspective on durability 1102, reliability 1104, and safety 1106 is shown in FIG. 11. Durability may be a prerequisite of the other two aspects (reliability 1104 and good specific capacity curves 106). The durability 1102 lies with battery performance from the materials to the cell and the system. A metric of consistent performance of a design needs to be established for durability 1102 under the desired operation condition. Durability 1102 includes the inherent properties of a device or a system to endure a duty schedule that it is designed for while exhibiting proper functionality.

To assess the reliability 1104 aspect, on the other hand, includes inspection of the durability 1102 with different stress factors while the system is subjected to various environmental impacts that affect the performance. Here, assessments towards physical integrity and functionality of the system will engage, and data analytics to quantify the effects are becoming more important. Separating stressful conditions versus abusive ones should be desired, which could be inherently challenging and difficult for conventional empirical approaches that rely on a large quantity of test results and correlated analyses. This is the area where data analytics could make a difference if it can effectively identify the mechanistic origins of cell degradation and failure and assist in establishing physics principles (versus arithmetic algorithms)-based models for prediction.

To address the safety 1106 aspect, the concept of reliability 1104 is extended to include the ability of the device or the system to endure human factors beyond the environmental ones such as personal preferences and habits, intent of use and its frequency, and so on and understand the impacts from these factors. Safety 1106 issues incur when the device or system was subjected to abuse or unintended use or when the system deteriorates and fails to function properly.

To amend this gap in knowledge, experiences based on FMEA establish a multi-scale holistic approach for a quantitative integration of knowledge to advance future battery design and manufacturing via coherent performance evaluation, data analytics, and modeling.

Failure mode and effect analysis (FMEA) is not a commonly discussed concept in the battery research community since it is not a standard protocol for basic research activities in research laboratories. It is also contrary to intuition that is established from typical training and education in which knowledge base is applied to accomplish something that is functional—a success is the intended result, not failure. Understanding failure is more complicated than comprehending how things work because to understand failure an understanding of functionality is needed.

To identify a failure mode, it is necessary to understand how to detect the symptoms and characteristics of the failure mode. In an FA the cause of failure is identified. Knowing the cause is not sufficient to prevent the failure or mitigate its risk. Thus, the ability to identify failure modes and quantify their effects make the FMEA a very useful tool to address reliability 1104 and safety 1106 issues of battery systems.

A couple of examples evaluate how FMEA can help addressing the reliability and safety aspects in LIB/RLB. Taking Li plating as an example, reliability 1104 may be analyzed. Lithium plating is considered as a failure mode. The cause of Li plating in LIB could be due to slow kinetics at low temperatures for the intercalation of Li into graphite anode, the rate of charging exceeding the current density that could be accommodated by the intercalation kinetics, deterioration of the graphite anode that could not accept the charge it is designed for, thick coverage of solid electrolyte interphase (SEI) on the surface of the graphite anode that affects the Li electrochemical diffusion and intercalation kinetics, or uneven distribution of the current in the graphite anode—to name a few that are often found in the literature. These descriptive explanations may help comprehending the issues but would not help solving the problems unless quantifiable evidence or a definitive condition are available to develop a tangible solution. In the literature, many use the criterion—Li plating will occur if the potential of the graphite anode goes below 0 V—as the basis for detecting Li plating. This criterion is based on a thermodynamic perspective, and it only serves one of the sufficient conditions for Li plating, but it might not be necessary to all conditions that could cause Li plating. One could find Li plating occurs under not-so-harsh conditions where the graphite anode potential is still well above 0 V.

With proper analytic methods using physicochemical characterizations and electrochemical data analyses, quantifiable Li plating may be accurately detected. This may be indicative of a trend to characterize the Li plating process with more viable techniques to identify and quantify conditions that can lead to Li plating and understand the necessary and sufficient condition for developing solutions.

Although traditional FA is a key approach to identify failure mode, its contribution in advancing future battery design and manufacturing is limited. On the other hand, FMEA could offer useful guidance in this aspect. However, FMEA's ability to provide quantitative and verifiable evidence to enable advanced battery design and manufacturing should be advanced. Such a knowledge base is still lacking today and should be strived for. The goal of traditional FMEA approach may be to make systems safer or more reliable by:

Evaluating the effects of component failures on system performance.
Identifying those components that are critical to safety.
Developing system enhancements or administrative changes to improve safety and/or system reliability.

The intent of the FMEA approach is to determine risk priority number (RPN), which includes three factors: probability of failure, severity, and detectability. The difficulty to quantify these risk factors often makes FMEA a non-starter for practice. In most cases and time, subjective and empirical scales are used to determine these factors, making FMEA semi-quantitative at the best.

To enhance FMEA's ability to help advancing battery design and manufacturing, applying quantification methods to elevate the functionality and capability of FMEA in order to conduct accurate battery diagnosis and prognosis in a verifiable manner will be a powerful tool and desirable approach. Such a quantitative FMEA can identify technology gaps and quantify deficiencies and the effects from technical improvements. Some examples are disclosed herein to illustrate the feasibility, concept, and approach of this advanced quantitative FMEA.

Failure analysis using proper analytics and physicochemical characterizations to separate failure modes and effects due to thermodynamic and kinetic origins may be used. The failure analysis could be used to establish a reliable FMEA method for advanced battery design and manufacturing. Careful and quantitative FMEA may be applied to commercial graphite-LCO cells, and the results of the FMEA may be attributed to failure modes and mechanisms from the cell performance down to electrode active materials level. Combining electrochemical data analysis and physicochemical characterizations, the failure modes that contributed to the cell capacity fade due to thermodynamic and kinetic attributes (based on mechanistic understanding) may be clearly identified and quantified. Such a quantitative understanding establishes the basis for a reliable FMEA that can verify the cell design and process engineering for manufacturing.

The same methodology may be used to qualify cells based on performance results obtained from testing and identified by data analytics with statistic distribution criteria for cell qualification, as discussed above. It should be noted that this quantitative FMEA approach has stepped away from pure empirical analyses and regressions in the traditional paradigm and is moving toward a principles-based prognostic approach that can be verified and validated by physical meanings and principles that poise greater propensity to predict results with desired accuracy and precision. More importantly, such principles-based predictions could be used as the basis for accurate monitoring and fault detection with clear boundaries governed by the principles.

Figure 12:
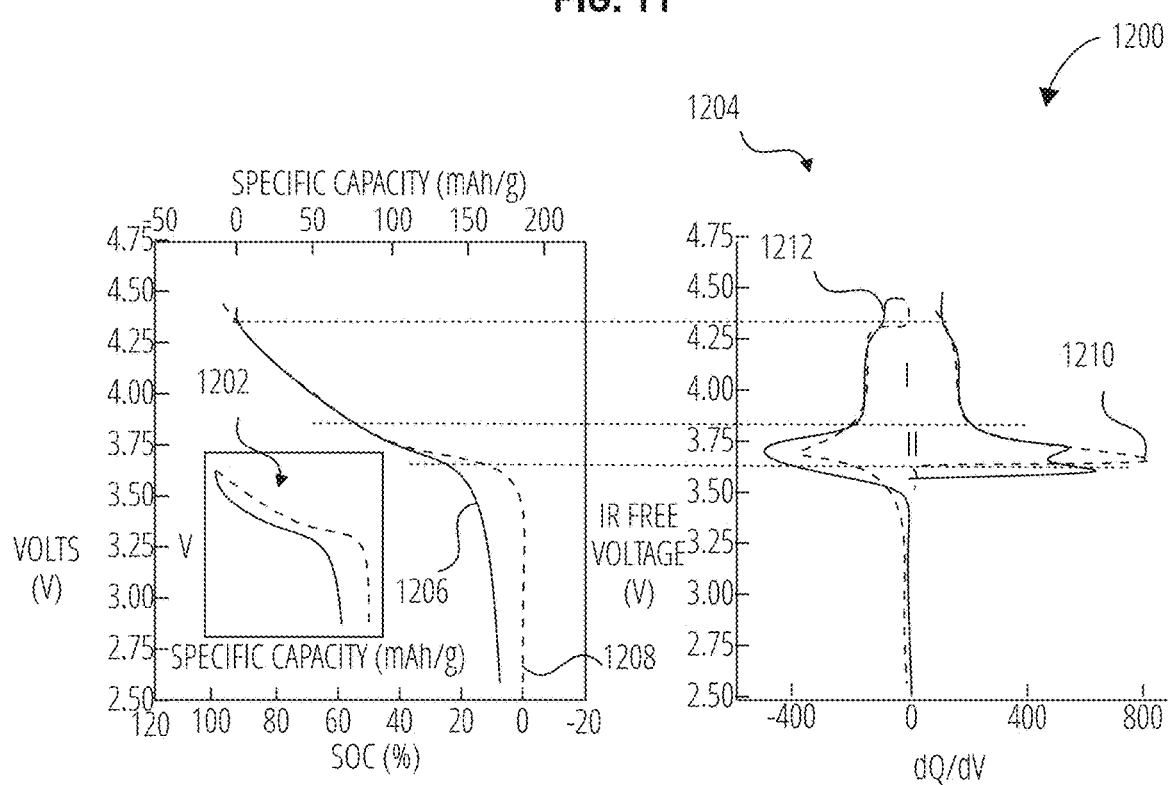
FIG. 12. includes eCAD plots illustrating an eCAD technique, according to some embodiments.

FIG. 12 includes eCAD plots 1200 illustrating an eCAD technique, according to some embodiments. The eCAD plots 1200 includes discharge curves 1202 of a Li-NMC 622 cell (shown in inset), which are derived into a C/3 analytical discharge curve 1206 for accurate SOC determination to depict the capacity correspondence. The eCAD plots 1200 also include a universal pseudo-OCV SOC curve 1208. The eCAD plots 1200 further include IR corrected dQ/dV curves 1204 corresponding to the C/3 analytical discharge curve 1206. The IR corrected dQ/dV curves 1204 include a C/3 cycle curve 1210 and an RPTO C/20 curve 1212. The IR corrected dQ/dV curves 1204 may reveal additional information about the electrochemical behavior of the cell.

FIG. 12 illustrate a powerful technique using eCAD to analyze cell performance. FIG. 12 illustrates how detailed quantitative data analytics support FMEA to derive a principles-based knowledge base for cell design and manufacturing. The discharge curves 1202, as shown in FIG. 12, were obtained from testing, as an example. These discharge curves 1202 showed that the cell delivered about 172 mAh/g capacity at C/3 rate at room temperature. The eCAD technique was used to remove IR polarization, scale the capacity (the scale presented at the top for the C/3 analytical discharge curve 1206 and the universal pseudo-OCV SOC curve 1208 in FIG. 12) to state-of-charge (SOC) (the scale presented at the bottom for the C/3 analytical discharge curve 1206 and the universal pseudo-OCV SOC curve 1208 in FIG. 5(a)), and align the C/3 analytical discharge curve 1206 with the universal pseudo-OCV SOC curve 1208—which represents the compositional correspondence of the NMC 622 in the Li intercalation reaction.

FIG. 12 emphasizes the importance of aligning the C/3 analytical discharge curve 1206 with the universal pseudo-OCV SOC curve 1208. First, the transformation of the universal pseudo-OCV SOC curve 1208 by eCAD eliminated a significant portion of the kinetic effects induced by the polarization, particularly from the Li ion transport in the electrolyte. Secondly, the alignment revealed the correspondence of the capacity and the Li content in NMC 622, allows identification of the thermodynamic attributes in the cell that contributed to the capacity fade. This approach of identifying and quantifying the capacity fade using thermodynamic principles gives the FMEA the ability to separate failure modes and effects by reliable and verifiable physical principles in a quantitative manner.

The IR corrected dQ/dV curves 1204 of FIG. 12 further illustrate the correspondence of the curves from the eCAD analytics and the incremental capacity (dQ/dV) analysis results. This correspondence revealed several useful aspects in the FMEA. The incremental capacity exhibits the reactivity of Li (i.e., the extent of intercalation and capacity increment arisen from the voltage activation by polarization) in the NMC lattice structure. In the figure, region I (between 4.35 V and 3.85 V) shows that the C/3 analytical discharge curve 1206 displays a smooth and steady voltage versus Li content relationship in NMC 622—representing a solid solution regime for the transformation of the layered H2 phase to a monoclinic (M) lattice structure where steady capacity increments are the results of the compositional changes associated with voltage perturbation. The characteristic plateau-like incremental capacity curve implies that the phase transition is a second-order type from an ordered H2 lattice structure to a disordered M lattice. In region II, between 3.85 V and 3.65 V, a distinct dQ/dV peak was present, implying a first-order phase transition from the (ordered) M to layered H1 lattice structure. The progressive transformation in the M composition from a disordered state to an ordered one seems difficult to be detected by the electrochemical analytical method during the discharge regime. In contrast, in the charge regime the sharp phase transition from H1 to M (ordered) and M (disordered) can be distinguished by the two dQ/dV peaks in region II, especially at a very slow charge rate such as C/20.

FIG. 12 provided a useful example how the quantitative FMEA by data analytics, physicochemical characterizations, and failure mode identification could play a critical role in quantifying failure effects and their influences on reliability and safety. This prospect may improve the ability to advance LIB/RLB development and deployment. The impacts on the remanufacturing, repurposing and recycle could also be expected, particularly using such a quantitative method to sort batteries at the end-of-use for the first application.

The status and the gaps in the current LIB and RLB research, development, and deployment in the supply chain were disclosed herein. In light of the strong demands for advanced, high-energy content LIB/RLB along with more complicated functionality, the challenging issues and barriers with reliability and safety of the RLB may continue to be of great concern by the industry and the consumer. Proposed and demonstrated herein is the use of failure analysis and a failure mode and effect analysis (FMEA)-based approach to overcome the challenges by accurate data analytics to identify failure modes in battery cells and quantify the failure effects with precise electrochemical diagnostics and physicochemical characterizations. Disclosed herein is building a knowledge-based approach that is established upon physical principles-based models and prognostics to help cell design and manufacturing. Such a quantitative FMEA, physical principles-based approach is different from conventional empirical approaches that rely on algorithmic regression. The predictions from the verified principle-based models versus the projections from the algorithmic ones should be more reliable to detect faults and monitor deviations for precise control, greatly improving the ability for advanced design and manufacturing of batteries.

Figure 13:
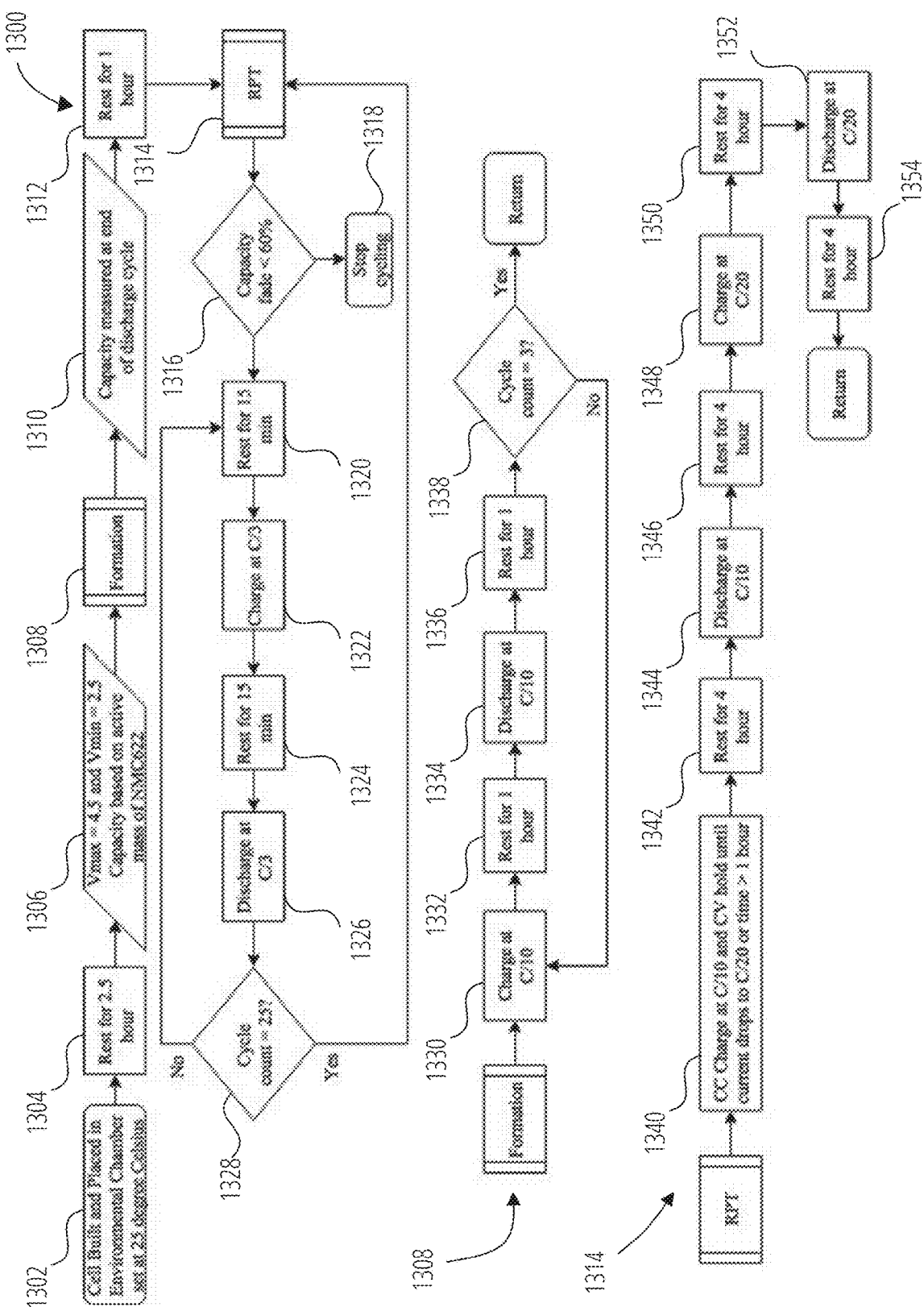
FIG. 13 is a flowchart illustrating cycle aging test protocols and schedule, according to some embodiments.

FIG. 13 is a flowchart illustrating cycle aging test protocols and schedule 1300, according to some embodiments. The cells were cycled inside an environmental chamber set at 25. C using either a Maccor 4000 or a Bio-Logic cycler between 2.5 V (Vmin) and 4.5 V (Vmax). The testing protocol and schedule is shown in the flowchart in FIG. 13. The cycle aging test protocols and schedule 1300 three formation cycles at C/10 rate. The capacity at the end of the third formation cycle was used as the nominal capacity of the cell. An initial Reference Performance Test (RPT-0) of the cell was used as the nominal capacity of the cell. The RPT comprises one C/10 and one C/20 charge-discharge cycle to evaluate the utilization of the NMC cathode active material at these rates. Twenty five (25) charge-discharge cycles at C/3 for performance evaluation were commenced after RPT-0, followed by RPT-1. Such a schedule was continued every 25 cycles to determine the state-of-health of the cell and its capacity fade cycle-by-cycle.

At operation 1302 the cycle aging test protocols and schedule 1300 includes building a cell and placing the cell in the environmental chamber set at 25. C. At operation 1304 the cycle aging test protocols and schedule 1300 includes resting the cell for substantially 2.5 hours. At measurements 1306 the cycle aging test protocols and schedule 1300 includes performing formation. At measurement 1310 the cycle aging test protocols and schedule 1300 includes measuring capacity at an end of the discharge cycle. At operation 1312 the cycle aging test protocols and schedule 1300 includes resting the cell for substantially one hour. At operation 1314 the cycle aging test protocols and schedule 1300 includes performing a reference performance test (RPT) on the cell.

At decision 1316 the cycle aging test protocols and schedule 1300 includes determining whether a capacity fade of the cell is less than 60%. If the capacity fade is not less than 60%, the cycle aging test protocols and schedule 1300 includes stopping the cycling at operation 1318. If, however, the capacity fade is less than 60%, the cycle aging test protocols and schedule 1300 includes resting the cell for substantially fifteen minutes at operation 1320. At operation 1322 the cycle aging test protocols and schedule 1300 includes charging the cell at C/3. At operation 1324 the cycle aging test protocols and schedule 1300 includes resting the cell for substantially fifteen minutes. At operation 1326 the cycle aging test protocols and schedule 1300 includes discharging the cell at C/3.

At decision 1328 the cycle aging test protocols and schedule 1300 includes determining whether the cycle count is equal to twenty-five. If the cycle count is equal to twenty five, the cycle aging test protocols and schedule 1300 includes returning to operation 1314, performing the RPT. If, however, the cycle count is not equal to twenty five, the cycle aging test protocols and schedule 1300 includes returning to operation 1320, charging the cell at C/3.

Operation 1308, formation, may include charging the cell at C/10 at operation 1330, resting the cell for substantially one hour at operation 1332, discharging the cell at C/10 at operation 1334, and resting the cell for substantially one hour at operation 1336. At decision 1338, operation 1308, formation includes determining whether the cycle count is equal to three. If the cycle count is not equal to three, operation 1308, formation, includes returning to operation 1330, charging the cell at C/10. If, however, the cycle count is equal to three, operation 1308, formation, includes returning to the cycle aging test protocols and schedule 1300 at operation 1308.

Operation 1314, performing the RPT, includes constant current (CC) charging the cell at C/10 and constant voltage (CV) holding the cell until current drops to C/20 or time is less than one hour at operation 1340, resting the cell for substantially four hours at operation 1342, discharging the cell at C/10 at operation 1344, and resting the cell for substantially four hours at operation 1346. Operation 1314, performing the RPT, also includes charging the cell at C/20 at operation 1348, resting the cell for substantially four hours at operation 1350, discharging the cell at C/20 at operation 1352, resting the cell for substantially four hours at operation 1354, and returning to the cycle aging test protocols and schedule 1300 at operation 1314.

Figure 14:
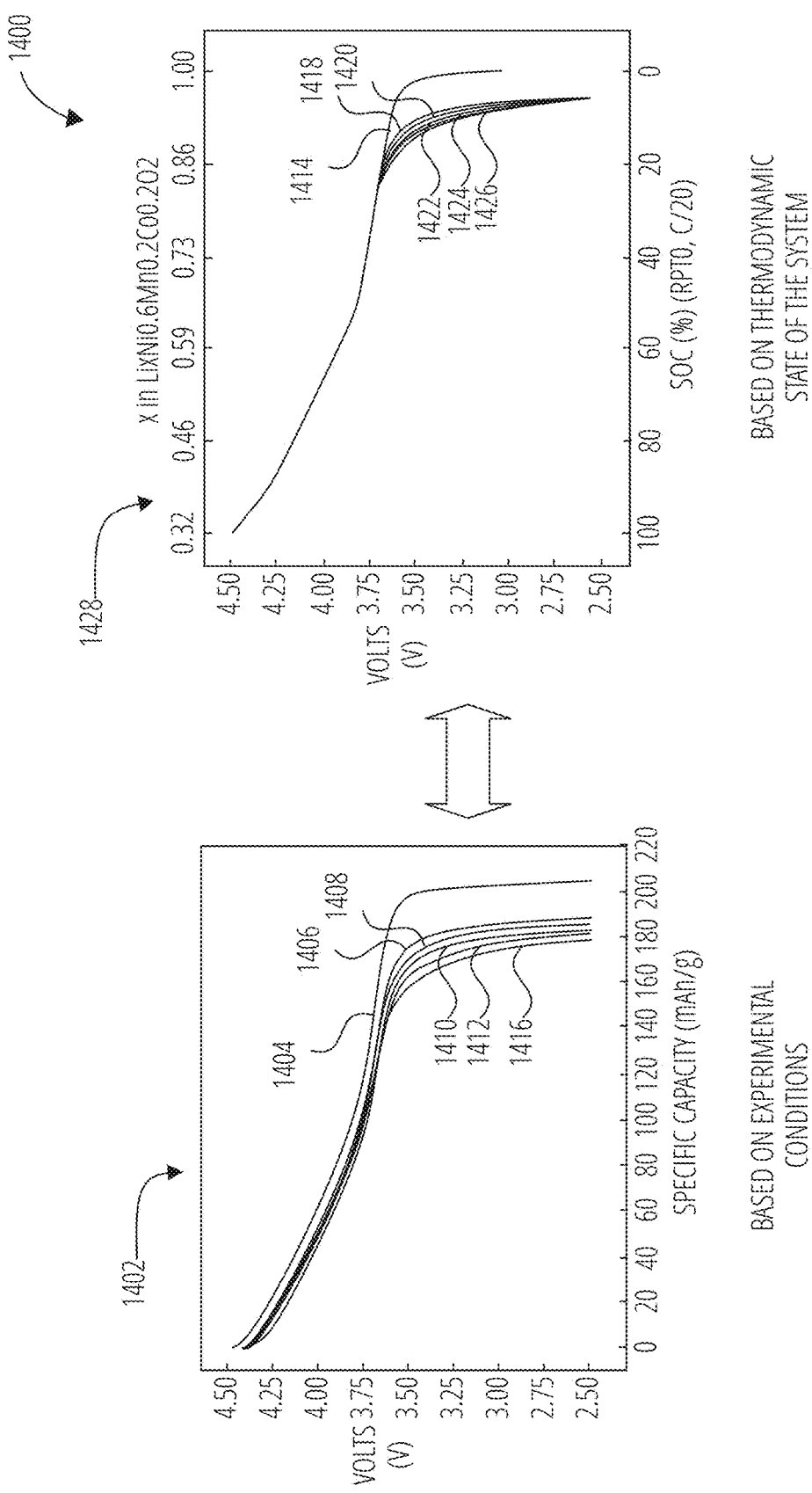
FIG. 14 includes plots illustrating eCAD transformation of discharge profiles into a comparable eCAD discharge curves for comparison and analysis with a universal pseudo-OCV-SOC curve, according to some embodiments.

FIG. 14 includes plots 1400 illustrating eCAD transformation of discharge profile curves 1402 into comparable eCAD discharge curves 1428 for comparison and analysis with a universal pseudo-OCV-SOC curve 1414, according to some embodiments. The discharge profile curves 1402 may be measurements taken during experimentation and may be based on experimental conditions. The discharge profile curves 1402 include an RPT-0 C/20 discharge curve 1404, a cycle 5 C/3 discharge curve 1406, a cycle 10 C/3 discharge curve 1408, a cycle 15 C/3 discharge curve 1410, a cycle 20 C/3 discharge curve 1412, and a cycle 25 C/3 discharge curve 1416. The Universal pseudo-OCV-SOC curve 1414 may be an analytic curve and may be based on a thermodynamic state of the system. The eCAD discharge curves 1428 include a universal pseudo-OCV-SOC curve 1414, a cycle 5 C/3 analytic discharge curve 1418, a cycle 10 C/3 analytic discharge curve 1420, a cycle 15 C/3 analytic discharge curve 1422, a cycle 20 C/3 analytic discharge curve 1424, and a cycle 25 C/3 analytic discharge curve 1426.

The unique aspect of the eCAD technique is shown in FIG. 14. The discharge profile curves 1402 from cycle aging experiments of an LME∥NMC-622 cell at C/3 rate and 25° C. (e.g., according to cycle aging test protocols and schedule 1300 of FIG. 13) are shown in FIG. 14. Using this experiment as an example, these discharge profile curves 1402 are transformed, as a function of experimental conditions, into the Universal pseudo-OCV-SOC curve 1414 to display the changes in the NMC composition and reveal attributes of capacity fade during cycle aging. The data transformation process is illustrated in FIG. 15.

Figure 15:
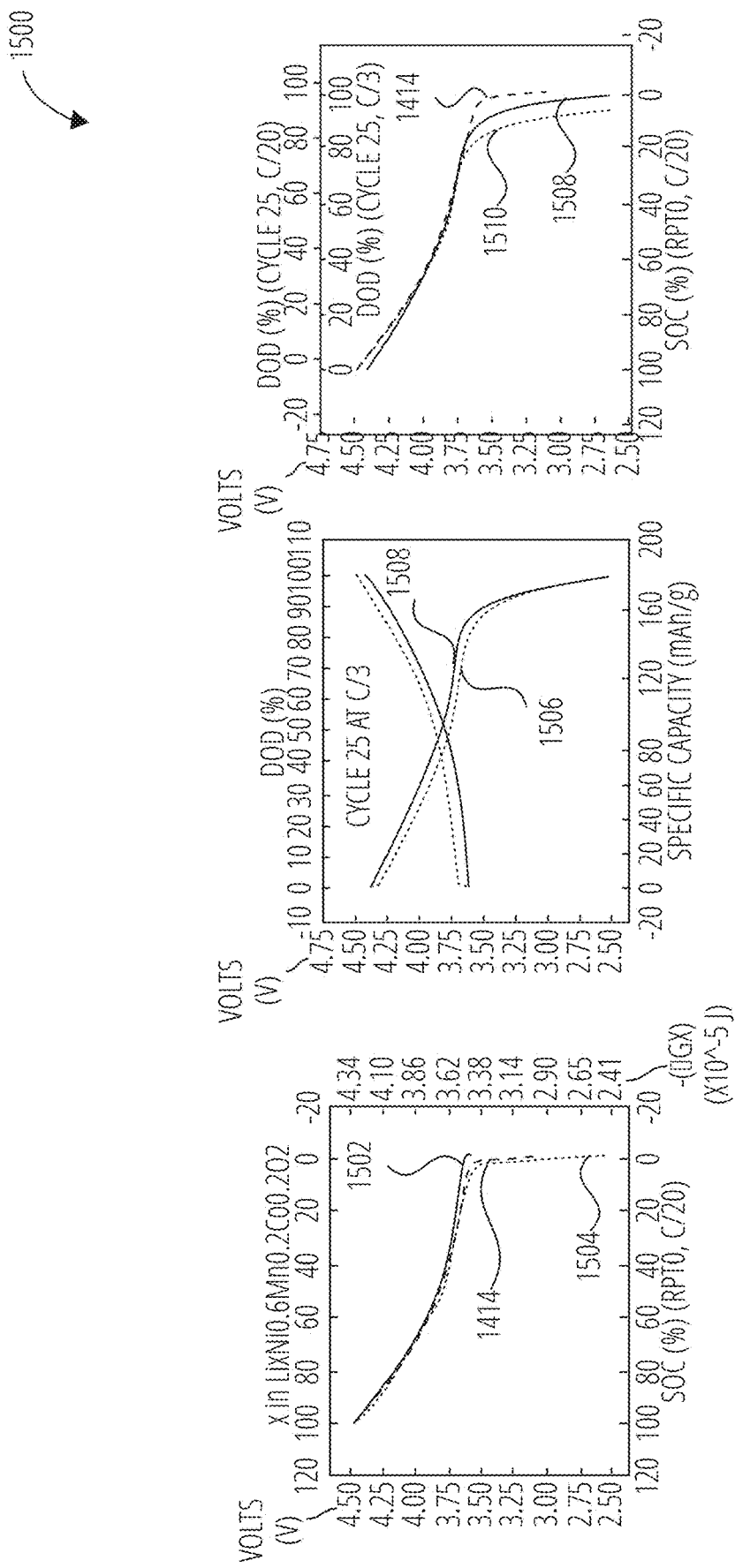
FIG. 15 illustrates a data transformation process that is used for transforming the discharge curves obtained from measurements of FIG. 14 to comparable eCAD discharge profiles for comparison and analysis with the Universal pseudo-OCV-SOC curve of FIG. 14.

FIG. 15 illustrates a data transformation process that is used for transforming the discharge profile curves 1402 obtained from measurements of FIG. 14 to comparable eCAD discharge curves 1428 for comparison and analysis with the Universal pseudo-OCV-SOC curve 1414 of FIG. 14. FIG. 15 illustrates data transformation curves 1500 including a charge at C/20 curve 1502, a discharge at C/20 curve 1504, and a universal pseudo-OCV-SOC curve 1414, which may be derived from the experimentally measured charge at C/20 curve 1502 and the discharge at C/20 curve 1504. The data transformation curves 1500 also include a cycle 25 C/3 experimental V-Q curve 1506 and a cycle 25 at C/3 $V_{IR\text{-}free}$-DOD curve 1508 derived from the cycle 25 C/3 experimental V-Q curve 1506. The data transformation curves 1500 further includes a scaled cycle 25 C/3 $V_{IR\text{-}free}$-SOC curve 1510.

The eCAD method is a thermodynamic state-based failure mode and effect analysis (FMEA) technique. Key to implement this eCAD method successfully is the use of thermodynamic states as the basis to properly infer the nature of the capacity fade in cycle aging. Such a basis is established by a well-defined correspondence between cell open circuit voltage (OCV) and SOC, which is universal without bias of size, shape, weight of the cell, and other cell design metrics including geometric dimensions, active material loading of the electrodes, porosity, and active surface area in each electrode, properties of the separator, and binder, etc. This OCV-SOC correspondence is a direct representation of the Gibbs free energy of the cell reaction (denoted as $\Delta G_{NMC\text{-}622}$) and the Li content in the active material's composition in the NMC-622 electrode; or, in a simplified notation as: $\Delta G_x$–x, where x is the Li content in NMC-622 in the pseudo-binary Li-NMC-622 system.

This universal relationship lays the foundation for inferring Li content in NMC-622. Applying this principle in the eCAD method to the LME‖NMC-622 cell, the following operations are used in the transformation of the analytic discharge curve:

Operation 1) Derive the pseudo-OCV versus SOC curve (e.g., universal pseudo-OCV-SOC curve 1414) from a set of charge discharge curves (e.g., charge at C/20 curve 1502 and discharge at C/20 curve 1504) at C/20 (as in reference performance test RPT-0). It is worth noting that this OCV-SOC curve can also be obtained by Galvanostatic Intermittent Titration Technique (GITT). However, the two methods should yield a very similar curve. Whereas the GITT curve would be populated with and traced by only data points determined by the experiments, this pseudo-OCV versus SOC curve obtained from the averaging of the charging-discharging curves gives the full characteristic over the entire SOC range. Thus, it is much more convenient and useful to use this averaging method of C/20 charging-discharging curves to yield the pseudo-OCV-SOC curve.

Operation 2) Transform a typical discharge curve (e.g., cycle 25 C/3 experimental V-Q curve 1506) at C/3 into an IR-free voltage ($V_{IR\text{-}free}$) versus specific capacity profile (a $V_{IR\text{-}free}$-$Q_{C/3}$ curve) and then into a $V_{IR\text{-}free}$ versus depth of discharge (DOD) profile (a $V_{IR\text{-}free}$-DOD curve at C/3 such as cycle 25 at C/3 $V_{IR\text{-}free}$-DOD curve 1508). Here, the effect of polarization is removed as much as possible to attain a state that is close to the OCV.

Operation 3) Transform the $V_{IR\text{-}free}$-DOD curve (e.g., cycle 25 at C/3 $V_{IR\text{-}free}$-DOD curve 1508) at C/3 into a capacity-at-C/20-based profile (e.g., scaled cycle 25 C/3 $V_{IR\text{-}free}$-SOC curve 1510) to correlate the scaled cycle 25 C/3 $V_{IR\text{-}free}$-SOC curve to the universal pseudo-OCV-SOC curve (e.g., universal pseudo-OCV-SOC curve 1414). Here, the capacity measured in the experiment is mapped to DOD first and then align with SOC. Using cycle 25 at C/3 $V_{IR\text{-}free}$-DOD curve 1508 as an example, at the end of discharge (EOD) the DOD is 100% at C/3. However, this $Q_{C/3}$ at 100% DOD is only 87.3% DOD in $Q_{C/20}$.

This transformation of DOD from $Q_{C/3}$ to $Q_{C/20}$ allows alignment of the curve with the pseudo-OCV-SOC at any point in time through cycle aging to reveal the failure modes and effects in the cell. This approach could also be applied to calendar aging studies with reference performance tests (RPTs). This process allows deciphering whether a deviation in the cell performance is related to (1) the Li content in the cathode (NMC-622) composition to determine the amount of materials loss (LAM and/or LLI)—thermodynamic origins—or (2) UAM due to KHP as attributed to additional polarization effects at the corresponding SOC as revealed by the $V_{IR\text{-}free}$ in the experiments—kinetic origins.

Figure 16:
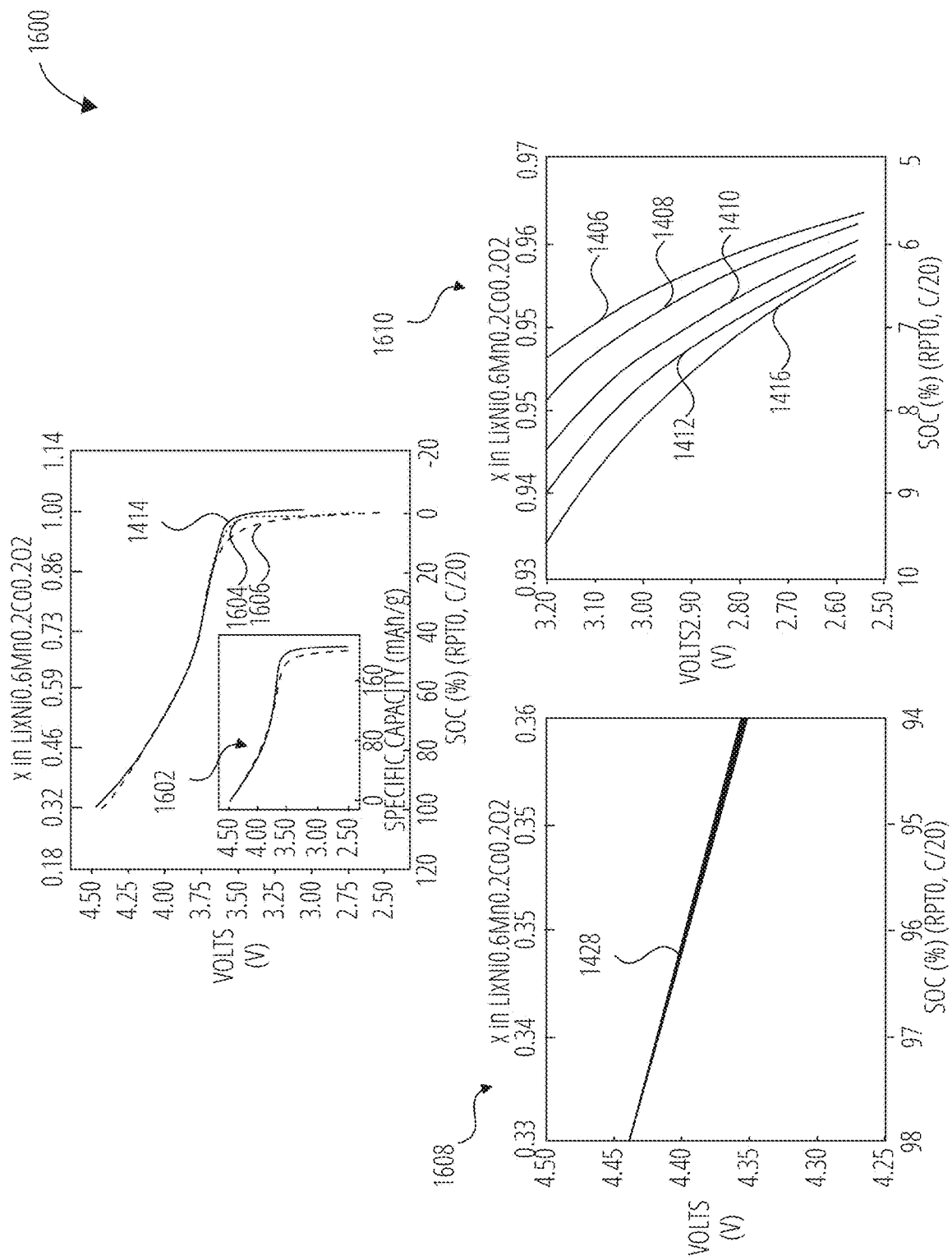
FIG. 16 includes cycle number-dependent capacity fade revealing curves, according to some embodiments.

FIG. 16 includes cycle number-dependent capacity fade revealing curves 1600, according to some embodiments. The rate dependent capacity fade revealing curves 1600 include experimental discharge curves 1602, the universal pseudo-OCV-SOC curve 1414, an RPT-0 C/20 analytic discharge curve 1604, an RPT-1 C/20 analytic discharge curve 1606, a first portion 1608 of the eCAD discharge curves 1428 of FIG. 14 (i.e., near beginning of discharge (BOD) from 98% to 94% SOC), and a second portion 1610 of the eCAD discharge curves 1428 (i.e., near end of discharge (EOD) from 10% to 5% SOC). It is noted that in the first portion 1608 near BOD the eCAD discharge curves 1428 do not manifest much divergence. In the second portion 1610, however, the cycle 5 C/3 discharge curve 1406, cycle 10 C/3 discharge curve 1408, cycle 15 C/3 discharge curve 1410, cycle 20 C/3 discharge curve 1412, and cycle 25 C/3 discharge curve 1416 have diverged sufficiently to distinguish therebetween. As a result, distinct features that reveal fading phenomena attributed to QF may be observed from the second portion 1610.

The rate dependent capacity fade revealing curves 1600 illustrate FMEA on an LME ☐☐ NMC-622 cell for revealing rate-dependent capacity fade (QF) during cycle aging. The RPT-0 C/20 analytic discharge curve 1604 and RPT-1 C/20 analytic discharge curve 1606 illustrate state changes in two reference performance tests (RPT-0 to RPT-1, C/20).

FIG. 16 shows the capability of thermodynamic state or SOC-based FMEA on a sample cell that behaved as anticipated from the cell design in the build. The RPT-0 C/20 analytic discharge curve 1604, the RPT-1 C/20 analytic discharge curve 1606, and the universal pseudo-OCV-SOC curve 1414 are shown. Variations between the universal pseudo-OCV-SOC curve 1414, the RPT-0 C/20 analytic discharge curve 1604, and the RPT-1 C/20 analytic discharge curve 1606 are near the 0% SOC point (e.g., near the EOD). As illustrated by the eCAD discharge curves 1428 in FIG. 14, as the discharge rate increased from C/20 to C/3, additional UAM attributes to the capacity loss could be revealed.

TABLE 2 provides more detailed information of the FMEA on the capacity fade (QF) and its attributes.

| Cycle | Capacity | Loss of Active Material ($QF_{LAM}$) | IR-induced UAM ($QF_{IR}$) | KPH-induced UAM ($QF_{KPH}$) |
|---|---|---|---|---|
| RPT-0 (C/20) | 204.52 | 0.00 | — | — |
| Cycle 1 | 189.90 | 0.26 | 14.36 | 0.00 |
| Cycle 5 | 187.61 | 1.32 | 14.36 | 1.24 |
| Cycle 10 | 185.31 | 2.64 | 14.36 | 2.21 |
| Cycle 15 | 183.02 | 3.97 | 14.36 | 3.18 |

TABLE 2-continued provides more detailed information of the FMEA on the capacity fade (QF) and its attributes.

| Cycle | Capacity | Loss of Active Material ($QF_{LAM}$) | IR-induced UAM ($QF_{IR}$) | KPH-induced UAM ($QF_{KPH}$) |
|---|---|---|---|---|
| Cycle 20 | 180.81 | 5.29 | 14.36 | 4.07 |
| Cycle 25 | 178.51 | 6.61 | 14.36 | 5.04 |
| RPT-1 (C/20) | 197.38 | 7.14 | — | — |
| Cycle 26 | 177.15 | 7.32 | 14.36 | 5.70 |
| Cycle 30 | 175.28 | 8.02 | 14.36 | 6.86 |
| Cycle 35 | 172.99 | 8.90 | 14.36 | 8.28 |
| Cycle 40 | 170.44 | 9.78 | 14.36 | 9.95 |
| Cycle 45 | 168.23 | 10.67 | 14.36 | 11.27 |
| Cycle 50 | 166.27 | 11.55 | 14.36 | 12.35 |
| RPT-2 (C/20) | 192.62 | 11.90 | — | — |

The results are summarized as follows:

$QF_{LAM}$ at C/20—The QC/20 fade from RPT-0 to RPT-1—is attributed to the loss of active material (LAM) in NMC-622 based on the following considerations:

The Li supply from LME is in significant excess in the cell build. There is no evidence to suggest that the Li supply was constrained in the first period of 25-cycle aging.

As shown in FIG. 16, the terminal compositions of NMC at the beginning of discharge (BOD) and EOD were almost identical in both the RPT-0 C/20 analytic discharge curve 1604 and the RPT-1 C/20 analytic discharge curve 1606. This result indicates the capacity came from the same compositional range in each test. Thus, if there were the same amount of NMC active material, we would expect to receive the same capacity. The difference in $Q_{C/20}$ from RPT-0 to RPT-1 therefore must be an active material loss.

However, one can arguably say that the SOC-based analytic discharge curves also indicated that KPH might have affected the utilization of NMC-622 (UAM) below 20% SOC. Therefore, the possibility of KPH that could also attribute to the capacity fade at C/20 ($QF_{KPH}$ at C/20) cannot be ruled out. What caused KPH cannot be concluded as yet, but a couple of usual suspects related to mass transport could be speculated. If so, $QF_{KPH}$ could be recurring but unlikely accumulative.

Furthermore, based on the discussion below and Table 2, there are additional $QF_{IR}$ C/3 and $QF_{KPH}$ at C/3 besides $QF_{LAM}$ at C/20. If $QF_{LAM}$ at C/20 were $QF_{KPH}$ at C/20, then $QF_{KPH}$ at C/3 and $QF_{KPH}$ at C/20 would have very similar quantities, at least on the same order of magnitude. It is unlikely that $QF_{KPH}$ is rate independent, especially between C/3 and C/20. Therefore, the possibility tends to be ruled out that that $QF_{KPH}$ at C/20 should account for $QF_{LAM}$ at C/20. On average $QF_{LAM}$ at C/20 occurred on the order of 0.26 mAh g$^{-1}$ per cycle or 6.61 mAh g$^{-1}$ over the entire 25 cycles of C/3 aging (if the loss were not linear).

$QF_{IR}$ at C/3—an ohmic DC resistance (IR drop)-induced capacity fade, an artifact due to rate-dependent UAM—is estimated on the order of 14.36 mAh g$^{-1}$ recurring in each cycle at C/3 for this cell. This quantity is estimated from the difference between the first cycle $Q_{C/3}$ and the $Q_{C/20}$ that was determined in RPT-0. Here it is assumed that:

The ohmic DC resistance of the cell is rather constant over the SOC range studied in the cycle aging. This series resistance should include all conductive parts associated with the electrical current in the solids along the cell reaction pathway and the ionic current in the bulk electrolyte and in most cases in the electrode's porous media. It should be noted that the data acquisition rate and the slew rate of the tester's power electronics could affect the precision of the measurements, and such issues are accounted for in this analysis.

At this stage of life, the morphology and electrode architecture of the NMC-622 cathode should not alter significantly to affect the electrode kinetics or mass transport in the pore structure of the cathode.

Likewise, the morphology of LME and Li deposition and stripping rates also stay relatively stable in the first period of 25-cycle aging for the cell.

$QF_{KPH}$ at C/3—an additional under-utilization of the NMC-622 cathode due to C/3 cycle aging—additional capacity fade on an order of magnitude similar to $QF_{LAM}$ at C/20 but cannot be accounted for by the previous two origins. This quantity increases with cycle number in a linear fashion in the first period of 25-cycle aging, as shown in Table 2. It is also worth noting that $QF_{KPH}$ at C/3 does change the terminal SOC at EOD cycle by cycle, unlike $QF_{LAM}$ at C/20, which does not.

The above-discussed QF attributes are consistent with the results exhibited in FIG. 14, where the cathode utilization near the end of discharge (e.g., below 30% SOC) began to show the toll of KPH as the rate increased from C/20 to C/3 and cycle by cycle, where $QF_{LAM}$ and $QF_{KPH}$ increase with cycle number. The sum of these losses as shown in the charge retention curve is rather linear.

Two unique aspects of this FMEA approach should be noted here: a. The point-to-point detection of deviations in $V_{IR-free}$ as a function of SOC in the course of cell reaction is a consistent and reliable assessment of Li content in the NMC-622 cathode. This capability offers the basis for a clear identification of capacity fade attributes and may offer the possibility to determine the Li inventory in LME, NMC cathode, and SEI formation with the electrolyte. b. This FMEA method applies thermodynamic principles to providing a reliable framework for accurate and precise fault detection in a quantitative manner.

The discussion for FIG. 13, FIG. 14, FIG. 15, and FIG. 16 shows the charge retention performance of a rechargeable Li metal cell and its cycle aging behavior. This sample cell is used to illustrate a quantitative failure mode and effect analysis (FMEA) based on thermodynamic state determination. Precise and accurate FMEA was demonstrated by true state-of-charge (SOC) correspondence and quantitative analysis of capacity fade (QF) attributes. These QF attributes include those from (1) the loss of active materials in the cathode ($QF_{LAM}$), (2) IR-induced, rate-dependent under-utilization of capacity ($QF_{IR}$), and (3) constrained transport-induced kinetic polarization hindrance that leads to increased under-utilization of the active material ($QF_{KPH}$) in the cathode. A reliable FMEA has been achieved to show the potential of this electrochemical analytic diagnosis method for guarding reliable and safe battery operation with the ability to monitor capacity fading attributes quantitatively.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method of qualifying rechargeable battery cells, the method comprising:
   taking measurements on the rechargeable battery cells, the measurements comprising charge and discharge profiles including battery voltage potential versus battery capacity relationships;
   determining specific capacity distributions of the rechargeable battery cells as a function of a number of discharge cycles based on the measurements;
   determining one or more specific capacity thresholds to separate the specific capacity distributions of the rechargeable battery cells into two or more classifications;
   identifying one or more capacity failure modes of the rechargeable battery cells selected from the group consisting of capacity fade due to loss of active materials in electrodes, capacity fade due to under-utilization of the active material's full capacity caused by IR-polarization, capacity fade due to kinetic polarization hindrance-induced under-utilization, and capacity fade due to loss of lithium inventory; and
   qualifying the rechargeable battery cells into the two or more classifications based, at least in part, on the specific capacity distributions, the one or more identified capacity failure modes, and the one or more specific capacity thresholds.

2. The method of claim 1, wherein:
   the two or more classifications include a first classification corresponding is high quality rechargeable battery cells; and
   qualifying the rechargeable battery cells into the two or more classifications includes assigning those of the rechargeable battery cells having specific capacity distributions bound by at least one of the specific capacity thresholds to the first classification.

3. The method of claim 2, further comprising selecting those of the rechargeable battery cells assigned to the first classification for use in a specific application.

4. The method of claim 2, further comprising excluding those of the rechargeable battery cells not assigned to the first classification from use in a specific application.

5. The method of claim 1, wherein the one or more specific capacity thresholds vary as a function of the number of discharge cycles.

6. The method of claim 1, wherein the one or more specific capacity thresholds reflect a selected maximum capacity fade rate value.

7. The method of claim 1, wherein identifying the one or more capacity failure modes of the rechargeable battery cells comprises using eCAD FMA to identify the one or more capacity failure modes.

8. A method of qualifying, rechargeable battery cells, the method comprising:
   taking measurements on the rechargeable battery cells, the measurements comprising charge and discharge profiles including battery voltage potential versus battery capacity relationships;

determining specific capacity distributions of the rechargeable battery cells as a function of a number of discharge cycles based on the measurements;

determining one or more specific capacity thresholds to separate the specific capacity distributions of the rechargeable battery cells into two or more classifications;

identifying capacity failure modes of the rechargeable battery cells by:

deriving a universal pseudo open cell voltage versus state of charge curve (universal pseudo-OCV-SOC curve) from a set of charge-discharge curves;

transforming a discharge curve at C/3, or any other C/n rates where n specifies a number of hours to fully discharge the capacity for a specific application, into an IR-free voltage ($V_{IR\text{-}free}$) versus specific capacity profile ($V_{IR\text{-}free}$-$Q_{C/3}$ or $V_{IR\text{-}free}$-$Q_{C/n}$ profile);

transforming the $V_{IR\text{-}free}$-$Q_{C/3}$ or $V_{IR\text{-}free}$-$Q_{C/n}$ profile into a $V_{IR\text{-}free}$ versus depth of discharge (DOD) profile ($V_{IR\text{-}free}$-DOD profile); and transforming the $V_{IR\text{-}free}$-DOD profile into a scaled $V_{IR\text{-}free}$-SOC curve to align the scaled $V_{IR\text{-}free}$-SOC curve to the universal pseudo-OCV-SOC curve and reveal the one or more failure modes; and qualifying the rechargeable battery cells into the two or more classifications based, at least in part, on the specific capacity distributions, the one or more identified capacity failure modes, and the one or more specific capacity thresholds.

9. The method of claim 8, further comprising:

manufacturing the rechargeable battery cells;

deploying those of the rechargeable battery cells qualified into a first classification of the two or more classifications into the product; and excluding those of the rechargeable battery cells qualified into one or more other classifications of the two or more classifications from deployment into the product.

10. The method of claim 9, further comprising employing an analysis-qualification-design-verification (AQDV) loop to complete a battery design-prototyping-production-deployment (DPPD) cycle with quantitative validation procedures and protocols to improve quality of the product.

11. The method of claim 10, wherein the AQDV loop includes cell qualification of the rechargeable battery cells, materials and electrode design of the rechargeable battery cells, cell design of the rechargeable battery cells, design qualification, product qualification, and performance qualification of the rechargeable battery cells.

12. The method of claim 11, wherein the AQDV loop includes diagnostics and prognostics, performance analysis, fault detection and life prediction, and quality control and assurance at each of the cell qualification, materials and electrode design, cell design, design qualification, product qualification, and performance qualification.

13. The method of claim 9, further comprising identifying a metric to specify a set of criteria for screening, selecting, filtering, and qualifying the first classification.

14. The method of claim 13, wherein the metric comprises thresholds based on capacity failure modes and effects as defined by eCAD failure mode and effect analysis (FMEA).

15. The method of claim 13, wherein the metric comprises a capacity distribution within one or more threshold values and a capacity fade rate.

16. The method of claim 13, wherein the metric is based at least in part on:

cell capacity of the rechargeable battery cells measured at a rate of C/20;

cell capacity of the rechargeable battery cells measured at a rate of C/3, or a suitable C/n rate where n specifies a number of hours to fully discharge the capacity for a specific application;

capacity fade due to loss of active materials in an electrode;

capacity fade due to under-utilization of the active material's full capacity due to IR-polarization;

capacity fade due to kinetic polarization hindrance-induced under-utilization; and capacity fade due to loss of lithium inventory.

17. The method of claim 9, wherein the rechargeable battery cells are taken from a same build and manifest substantially the same charge retention behavior responsive to a first charge-discharge cycle.

18. The method of claim 9, wherein the one or more specific capacity thresholds reflect a selected maximum capacity fade rate value.

* * * * *